United States Patent
Kim et al.

(10) Patent No.: US 10,558,118 B2
(45) Date of Patent: Feb. 11, 2020

(54) PHOTOSENSITIVE RESIN COMPOSITION, BLACK PIXEL DEFINING LAYER USING THE SAME AND DISPLAY DEVICE

(71) Applicant: SAMSUNG SDI CO., LTD., Suwon-si, Gyeonggi-do (KR)

(72) Inventors: Sang Soo Kim, Suwon-si (KR); Jinhee Kang, Suwon-si (KR); Heekyoung Kang, Suwon-si (KR); Chang-Hyun Kwon, Suwon-si (KR); Jiyun Kwon, Suwon-si (KR); ChanWoo Kim, Suwon-si (KR); Bumjin Lee, Suwon-si (KR); Junho Lee, Suwon-si (KR); Chungbeum Hong, Suwon-si (KR)

(73) Assignee: Samsung SDI Co., Ltd., Yongin-si, Gyeonggi-do (KR)

(*) Notice: Subject to any disclaimer, the term of this patent is extended or adjusted under 35 U.S.C. 154(b) by 204 days.

(21) Appl. No.: 15/704,305

(22) Filed: Sep. 14, 2017

(65) Prior Publication Data
US 2018/0231889 A1 Aug. 16, 2018

(30) Foreign Application Priority Data
Feb. 16, 2017 (KR) .......................... 10-2017-0021076

(51) Int. Cl.
| | |
|---|---|
| G03F 7/037 | (2006.01) |
| G03F 7/031 | (2006.01) |
| G03F 7/038 | (2006.01) |
| G03F 7/039 | (2006.01) |
| G03F 7/075 | (2006.01) |
| G03F 7/32 | (2006.01) |
| G03F 7/004 | (2006.01) |
| H01L 27/32 | (2006.01) |
| H01L 51/52 | (2006.01) |
| H01L 51/00 | (2006.01) |
| G03F 7/00 | (2006.01) |

(52) U.S. Cl.
CPC ............ *G03F 7/037* (2013.01); *G03F 7/0007* (2013.01); *G03F 7/0048* (2013.01); *G03F 7/031* (2013.01); *G03F 7/038* (2013.01); *G03F 7/039* (2013.01); *G03F 7/0757* (2013.01); *G03F 7/322* (2013.01); *H01L 27/3246* (2013.01); *H01L 51/004* (2013.01); *H01L 51/0043* (2013.01); *H01L 51/5284* (2013.01)

(58) Field of Classification Search
CPC ...... G03F 7/037; G03F 7/0757; G03F 7/0007; G03F 7/0031; G03F 7/038; G03F 7/0039; G03F 7/0048; G03F 7/322; G03F 27/3246; G03F 51/004; G03F 51/5284
See application file for complete search history.

(56) References Cited

U.S. PATENT DOCUMENTS

| | | | | |
|---|---|---|---|---|
| 4,321,319 A * | 3/1982 | Shoji | ................. | C08G 73/1025 430/270.1 |
| 4,332,882 A * | 6/1982 | Ahne | .................... | G03F 7/0387 430/18 |
| 4,515,887 A * | 5/1985 | Davis | ................... | C08G 73/106 430/283.1 |
| 4,673,773 A * | 6/1987 | Nakano | ................ | C08G 69/265 174/258 |
| 5,270,431 A * | 12/1993 | Blum | ................... | C08G 18/348 528/69 |
| 5,587,275 A * | 12/1996 | Kato | ..................... | G03F 7/0387 430/283.1 |
| 5,616,448 A * | 4/1997 | Kato | ..................... | G03F 7/0387 430/283.1 |
| 5,914,354 A * | 6/1999 | Kato | ................... | C08G 73/1003 430/283.1 |
| 9,085,661 B1 | 7/2015 | Tan et al. | | |
| 2011/0200939 A1* | 8/2011 | Lee | ........................ | C08G 73/10 430/280.1 |
| 2018/0079864 A1* | 3/2018 | Kawabata | ............. | G03F 7/0212 |

FOREIGN PATENT DOCUMENTS

| | | |
|---|---|---|
| CN | 101573409 A | 4/2009 |
| JP | 10-111568 A | 4/1998 |
| JP | 2005-148611 A | 6/2005 |

(Continued)

OTHER PUBLICATIONS

Machine translation of KR101401145 (Jun. 2014).*

(Continued)

*Primary Examiner* — Martin J Angebranndt
(74) *Attorney, Agent, or Firm* — Lee & Morse, P.C.

(57) ABSTRACT

Provided are a photosensitive resin composition including (A) a binder resin, the binder resin including a polymer that includes a structural unit represented by Chemical Formula 1; (B) a black colorant; (C) a photopolymerizable monomer; and (D) a photopolymerization initiator a black pixel defining layer manufactured using the same, and a display device including the black pixel defining layer,

[Chemical Formula 1]

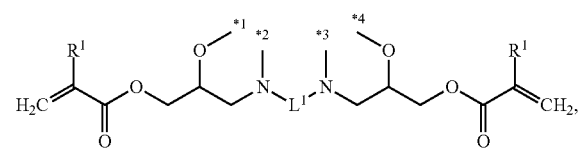

wherein, in Chemical Formula 1, each substituent is the same as defined in the detailed description.

14 Claims, No Drawings

(56) References Cited

FOREIGN PATENT DOCUMENTS

| | | | |
|---|---|---|---|
| JP | 2006-227063 A | 8/2006 | |
| JP | 2010-008780 * | 1/2010 | ............. G06F 7/027 |
| JP | 4899695 B2 | 3/2012 | |
| JP | 5504735 B2 | 5/2014 | |
| KR | 10-0548625 B1 | 1/2006 | |
| KR | 10-1010036 B1 | 1/2011 | |
| KR | 10-1401145 B1 | 6/2014 | |
| TW | 201512778 A | 4/2015 | |
| TW | 201701074 A | 1/2017 | |
| WO | WO 2014-088161 A1 | 6/2014 | |

OTHER PUBLICATIONS

Taiwanese Search Report dated Jun. 20, 2018, which was attached to the Office Action dated Jun. 26, 2018, of the corresponding Taiwanese Patent Application No. 106131906.

* cited by examiner

PHOTOSENSITIVE RESIN COMPOSITION, BLACK PIXEL DEFINING LAYER USING THE SAME AND DISPLAY DEVICE

CROSS-REFERENCE TO RELATED APPLICATION

Korean Patent Application No. 10-2017-0021076, filed on Feb. 16, 2017, in the Korean Intellectual Property Office, and entitled: "Photosensitive Resin Composition, Black Pixel Defining Layer Using the Same and Display Device," is incorporated by reference herein in its entirety.

BACKGROUND

1. Field

Embodiments relate to a photosensitive resin composition, a black pixel defining layer using the same, and a display device.

2. Description of the Related Art

A photosensitive resin composition may be used to manufacture a color filter, a liquid crystal display material, a display device such as an organic light emitting diode, a display device panel material, and the like.

SUMMARY

Embodiments are directed to a photosensitive resin composition, including (A) a binder resin, the binder resin including a polymer that includes a structural unit represented by Chemical Formula 1; (B) a black colorant; (C) a photopolymerizable monomer; and (D) a photopolymerization initiator,

[Chemical Formula 1]

In Chemical Formula 1, each $R^1$ may independently be a hydrogen atom or a substituted or unsubstituted C1 to C20 alkyl group, $*^1$, $*^2$, $*^3$, and $*^4$ are bonds to other moieties of the polymer, and $L^1$ may be represented by one of Chemical Formula 1-1 to Chemical Formula 1-3,

[Chemical Formula 1-1]

In Chemical Formula 1-1, $L^2$ may be a substituted or unsubstituted C1 to C10 alkylene group, an oxygen atom, a sulfur atom, or —S(=O)$_2$—*, and each * is a bond to another moiety of the polymer,

[Chemical Formula 1-2]

In Chemical Formula 1-2, $R^2$ to $R^5$ may independently be a hydrogen atom or a substituted or unsubstituted C1 to C10 alkyl group, $L^3$ and $L^4$ may independently be a substituted or unsubstituted C1 to C10 alkylene group, and each * is a bond to another moiety of the polymer,

[Chemical Formula 1-3]

In Chemical Formula 1-3, $R^6$ and $R^7$ may independently be a hydrogen atom or a substituted or unsubstituted C1 to C10 alkyl group, $L^5$ and $L^6$ may independently be a substituted or unsubstituted C1 to C10 alkylene group, n may be an integer ranging from 1 to 10, and each * is a bond to another moiety of the polymer.

The $*^1$, $*^2$, $*^3$, and $*^4$ may be hydrogen atoms or backbone moieties of the polymer.

The $*^1$ and $*^2$ may be hydrogen atoms, and $*^3$ and $*^4$ may be backbone moieties of the polymer.

The $*^1$ and $*^2$ may be backbone moieties of the polymer, and $*^3$ and $*^4$ may be hydrogen atoms.

The polymer may further include a structural unit represented by Chemical Formula 2:

[Chemical Formula 2]

In Chemical Formula 2, each * is a bond to another moiety of the polymer.

The polymer may include a structural unit represented by Chemical Formula 3 or Chemical Formula 4:

[Chemical Formula 3]

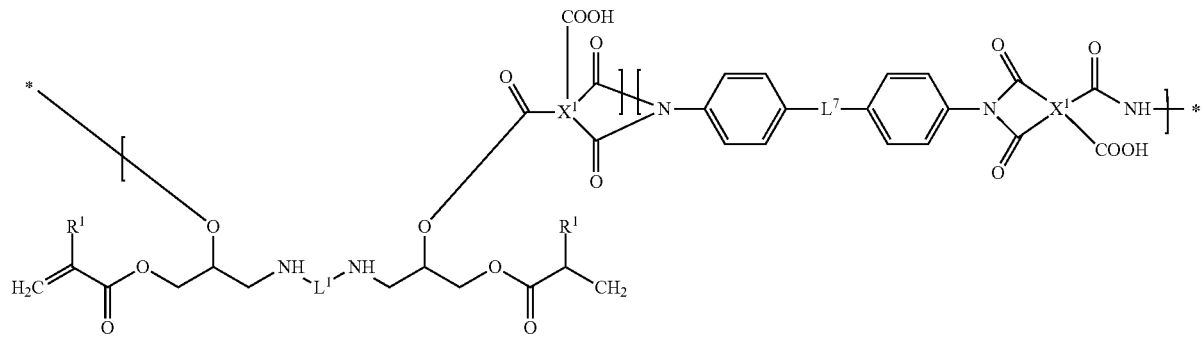

[Chemical Formula 4]

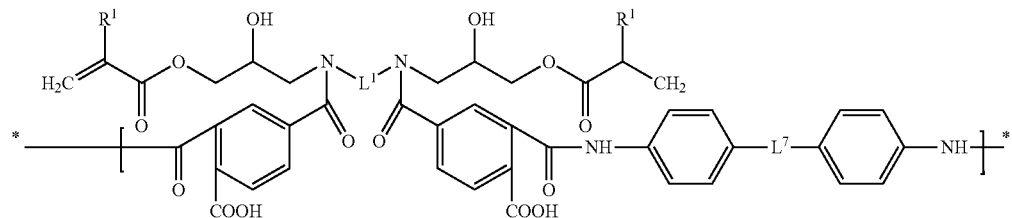

In Chemical Formula 3 and Chemical Formula 4, each $R^1$ may be a hydrogen atom or a substituted or unsubstituted C1 to C20 alkyl group, $L^1$ may be represented by one of Chemical Formula 1-1 to Chemical Formula 1-3, $L^7$ may be represented by Chemical Formula 1-1, and $X^1$ may be represented by Chemical Formula 1-4,

[Chemical Formula 1-4]

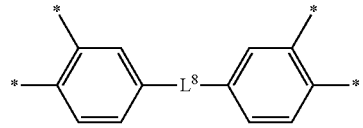

In Chemical Formula 1-4, $L^8$ may be a single bond or a substituted or unsubstituted C1 to C10 alkylene group, and each * is a bond to another moiety of the polymer.

The polymer may include the structural unit represented by Chemical Formula 3, and the structural unit represented by Chemical Formula 3 may be represented by one of Chemical Formula 3-1 to Chemical Formula 3-6:

[Chemical Formula 3-1]

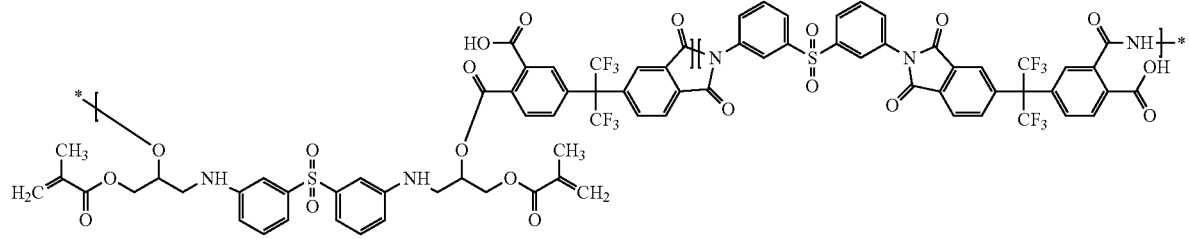

[Chemical Formula 3-2]

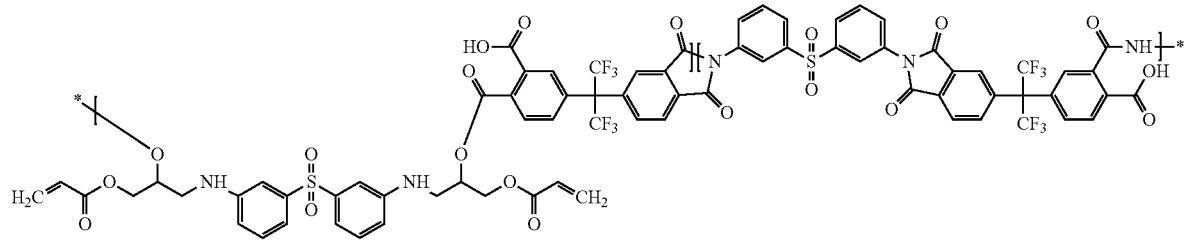

[Chemical Formula 3-3]
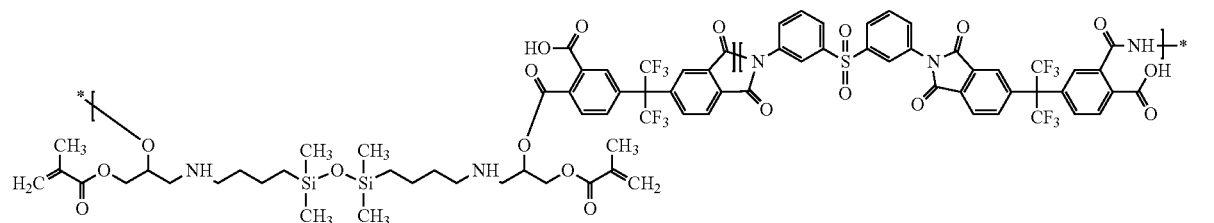
[Chemical Formula 3-4]
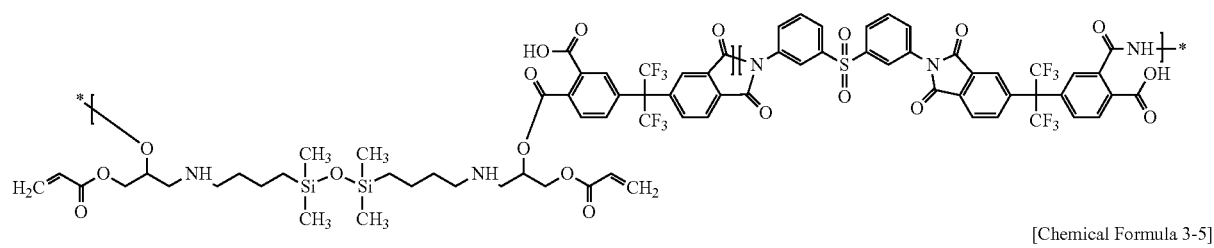
[Chemical Formula 3-5]
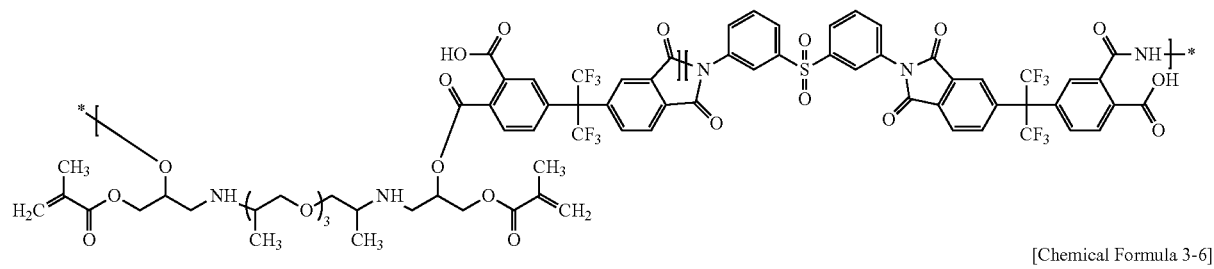
[Chemical Formula 3-6]
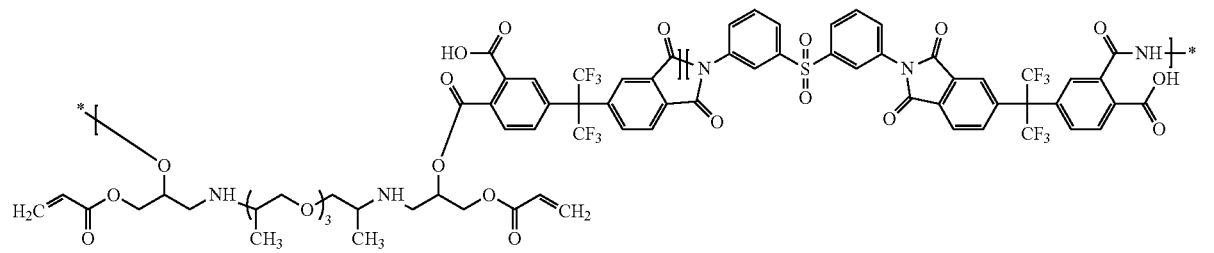
The polymer may include the structural unit represented by Chemical Formula 4, and the structural unit represented by Chemical Formula 4 is represented by one of Chemical Formula 4-1 to Chemical Formula 4-4:
[Chemical Formula 4-1]
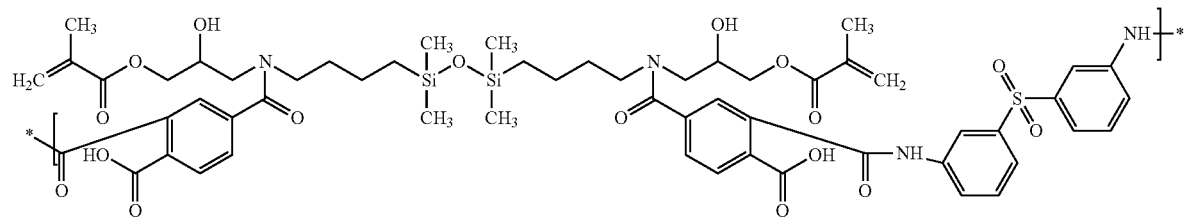
[Chemical Formula 4-2]
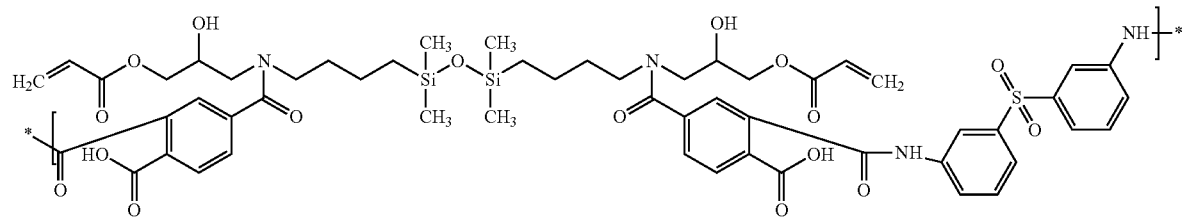

[Chemical Formula 4-3]

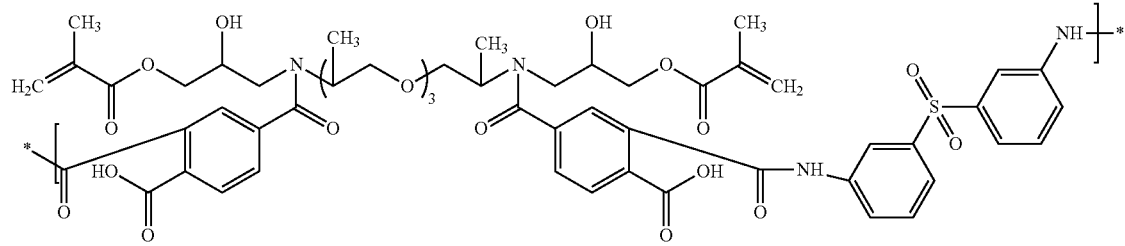

[Chemical Formula 4-4]

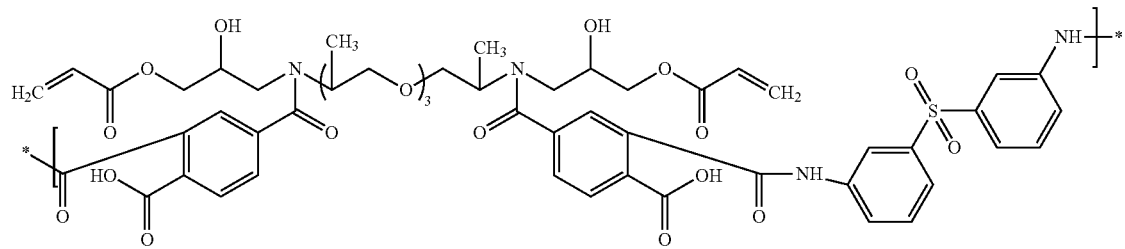

The polymer may have a weight average molecular weight of about 3.000 g/mol to about 20,000 g/mol.

The black colorant may include an organic black pigment.

The photopolymerizable monomer may include a compound including at least two functional groups represented by Chemical Formula 5:

[Chemical Formula 5]

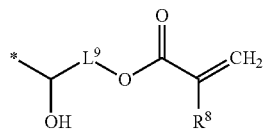

In Chemical Formula 5, $R^8$ may be a hydrogen atom or a substituted or unsubstituted C1 to C10 alkyl group, $L^9$ may be a single bond or a substituted or unsubstituted C1 to C10 alkylene group, and

* is a bond to another moiety of the monomer.

The compound including at least two functional groups represented by Chemical Formula 5 may be a compound represented by Chemical Formula 6 or Chemical Formula 7:

[Chemical Formula 6]

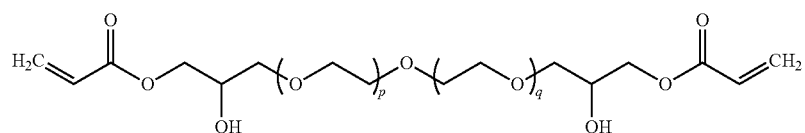

[Chemical Formula 7]

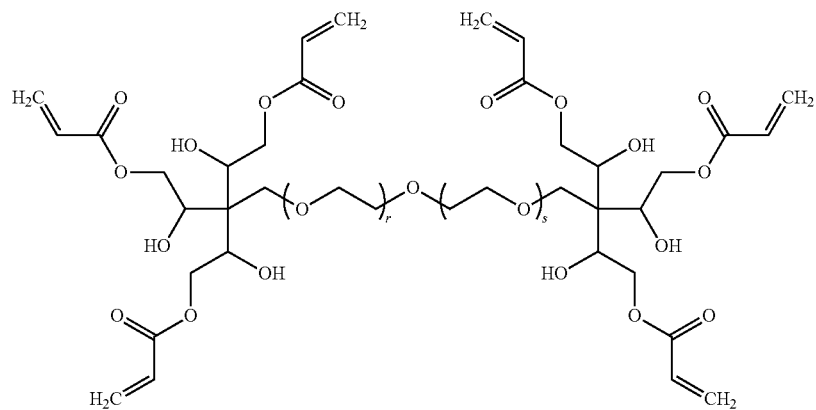

In Chemical Formula 6 and Chemical Formula 7, p, q, r, and s may independently be an integer ranging from 1 to 10.

The photosensitive resin composition may include about 1 wt % to about 30 wt % of (A) the polymer; about 1 wt % to about 25 wt % of (B) the black colorant; about 0.5 wt % to about 10 wt % of (C) the photopolymerizable monomer; about 0.1 wt % to about 5 wt % of (D) the photopolymerization initiator; and (E) a solvent, based on a total amount of the photosensitive resin composition.

The photosensitive resin composition may further include malonic acid, 3-amino-1,2-propanediol, a silane-based coupling agent, a leveling agent, a surfactant, a radical polymerization initiator, or a combination thereof.

Embodiments are also directed to a black pixel defining layer manufactured using the photosensitive resin composition according to an embodiment.

Embodiments are also directed to a display device including the black pixel defining layer according to an embodiment.

The display device may be an organic light emitting diode (OLED).

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing FIGURES, the dimensions of layers and regions may be exaggerated for clarity of illustration. Like reference numerals refer to like elements throughout.

As used herein, when specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when specific definition is not otherwise provided, "substituted" refers to replacement of at least one hydrogen atom by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when specific definition is not otherwise provided, "hetero" refers to inclusion of at least one heteroatom of N, O, S, and P in chemical formulae.

As used herein, when specific definition is not otherwise provided, "(meth)acrylate" refers to both "acrylate" and "methacrylate", and "(meth)acrylic acid" refers to "acrylic acid" and "methacrylic acid".

As used herein, when a definition is not otherwise provided, the term "combination" refers to mixing or copolymerization. In addition, "copolymerization" refers to block copolymerization to random copolymerization, and "copolymer" refers to a block copolymer to a random copolymer.

In chemical formulae of the present specification, unless a specific definition is otherwise provided, hydrogen is bonded at the position when a chemical bond is not drawn where supposed to be given.

As used herein, when specific definition is not otherwise provided, "*" indicates a point where the same or different atom (including a hydrogen atom) or chemical formula is linked.

A photosensitive resin composition according to an example embodiment includes (A) a binder resin including polymer that includes a structural unit represented by Chemical Formula 1; (B) a black colorant; (C) a photopolymerizable monomer; and (D) a photopolymerization initiator. In an embodiment, the composition may further include (E) a solvent.

[Chemical Formula 1]

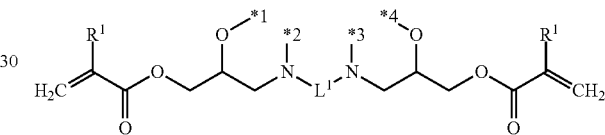

In Chemical Formula 1, $R^1$ is a hydrogen atom or a substituted or unsubstituted C1 to C20 alkyl group, $*^1$, $*^2$, $*^3$, and $*^4$ are bonds to other moieties of the polymer, and $L^1$ is represented by one of Chemical Formula 1-1 to Chemical Formula 1-3,

[Chemical Formula 1-1]

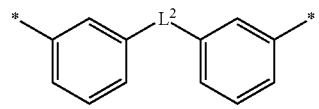

wherein, in Chemical Formula 1-1, $L^2$ is a substituted or unsubstituted C1 to C10 alkylene group, an oxygen atom, a sulfur atom, or $*-S(=O)_2-*$, and each * is a bond to another moiety of the polymer,

[Chemical Formula 1-2]

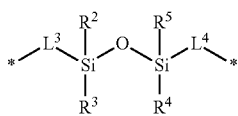

wherein, in Chemical Formula 1-2, $R^2$ to $R^5$ are independently a hydrogen atom or a substituted or unsubstituted C1 to C10 alkyl group, $L^3$ and $L^4$ are independently a substituted or unsubstituted C1 to C10 alkylene group, and each * is a bond to another moiety of the polymer,

[Chemical Formula 1-3]

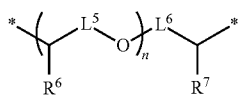

wherein, in Chemical Formula 1-3, $R^6$ and $R^7$ are independently a hydrogen atom or a substituted or unsubstituted C1 to C10 alkyl group, $L^5$ and $L^6$ are independently a substituted or unsubstituted C1 to C10 alkylene group, n is an integer ranging from 1 to 10, and each * is a bond to another moiety of the polymer.

Generally, a binder resin used for a photosensitive resin composition may include a polymer that includes no structural unit represented by Chemical Formula 1 and radical cross-linking may not be sufficiently performed. In such a case, the photosensitive resin composition may exhibit reduced contrast ratio when developed in an aqueous developing solution after exposure to form a pattern. To improve the contrast ratio, it has been considered to increase a ratio of a photopolymerizable monomer and thus a photocurable ratio. However, such a change may deteriorate heat resistance despite improving the contrast ratio.

According to an example embodiment, a photosensitive resin composition includes a binder resin including a polymer including the structural unit represented by Chemical Formula 1. The photosensitive resin composition according to an example embodiment may provide improved heat resistance, an improved contrast ratio, and a stable, narrowed taper pattern (for example, a low taper angle of about 25° to about 32°) and simultaneously improve sensitivity.

In an example embodiment, the photosensitive resin composition includes a polymer that includes structural units represented by Chemical Formulae 1 and 2. In the polymer, the structural unit represented by Chemical Formula 1, having a radical cross-linkable functional group, when combined with the structural unit represented by Chemical Formula 2, may help provide a pattern that may be formed using an aqueous developing solution, and have a lower taper angle and improved sensitivity.

Hereinafter, each component is specifically described.

(A) Binder Resin

The binder resin in a photosensitive resin composition according to an example embodiment includes a polymer that includes the structural unit represented by Chemical Formula 1. The binder resin may improve sensitivity while maintaining a lower taper angle by including the polymer that includes the structural unit represented by Chemical Formula 1. In addition, the structural unit represented by Chemical Formula 1 may be acrylic cross-linkable, and a photosensitive resin composition including the same may be used with an aqueous developing solution during development (if an organic developing solution is used, developability may be deteriorated).

In an example embodiment, the polymer may further include a structural unit represented by Chemical Formula 2.

[Chemical Formula 2]

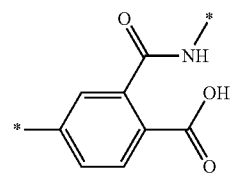

According to the present example embodiment, the polymer includes the structural unit represented by Chemical Formula 2 having heat resistance and capable of improving a contrast ratio desirable for a negative-type photosensitive resin composition with the acrylic cross-linkable (radical cross-linkable) structural unit represented by Chemical Formula 1, and thereby a contrast ratio and heat resistance may be improved, and simultaneously improved sensitivity and a lowered taper angle may be obtained during formation of a pattern after exposing a photosensitive resin composition including the binder resin.

In an example embodiment, the polymer may include a structural unit represented by Chemical Formula 3 or Chemical Formula 4.

[Chemical Formula 3]

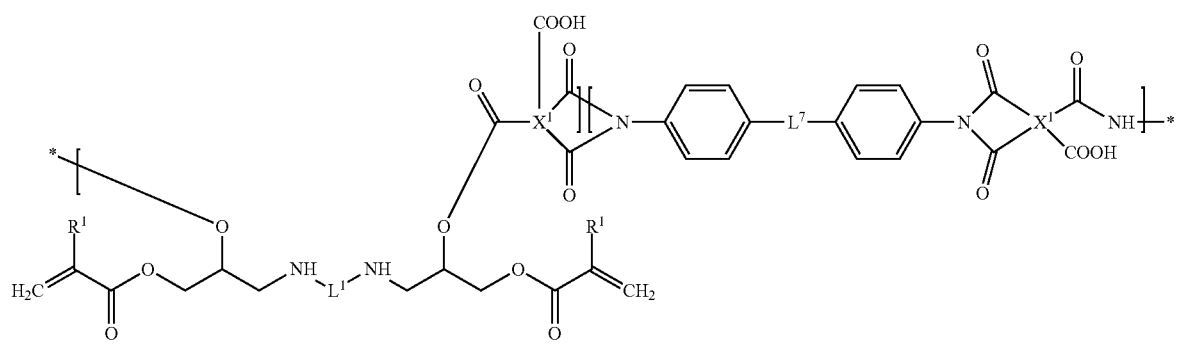

[Chemical Formula 4]

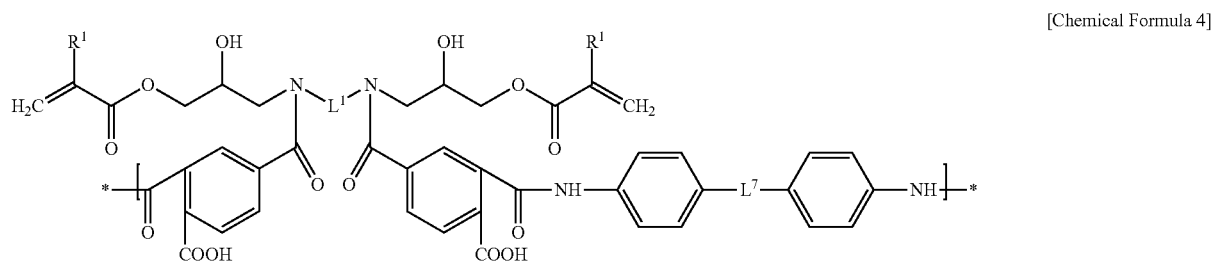

In Chemical Formula 3 and Chemical Formula 4, $R^1$ is a hydrogen atom or a substituted or unsubstituted C1 to C20 alkyl group, $L^1$ is represented by one of Chemical Formula 1-1 to Chemical Formula 1-3, $L^7$ is represented by Chemical Formula 1-1, and $X^1$ is represented by Chemical Formula 1-4,

[Chemical Formula 1-4]

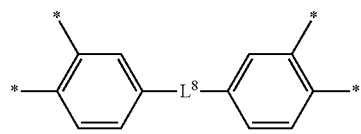

wherein, in Chemical Formula 1-4, $L^8$ is a single bond or a substituted or unsubstituted C1 to C10 alkylene group, and each * is a bond to another moiety of the polymer.

For example, the structural unit represented by Chemical Formula 3 may be represented by one of Chemical Formula 3-1 to Chemical Formula 3-6.

[Chemical Formula 3-1]

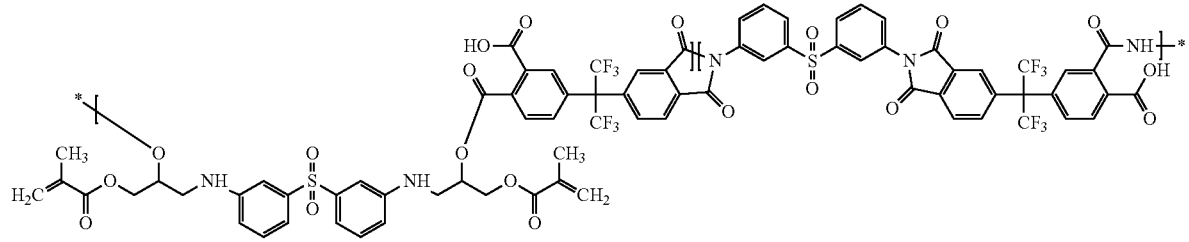

[Chemical Formula 3-2]

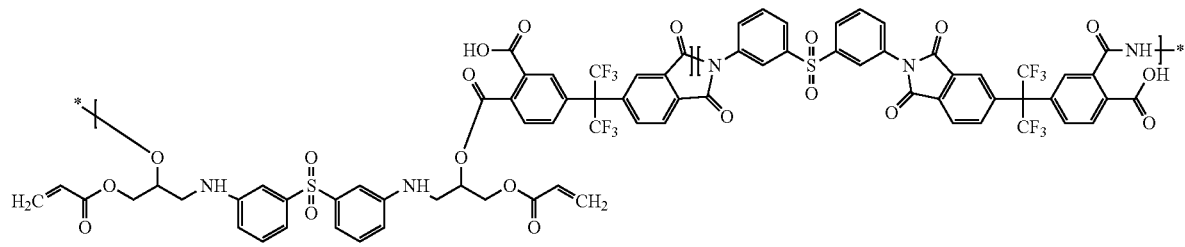

[Chemical Formula 3-3]

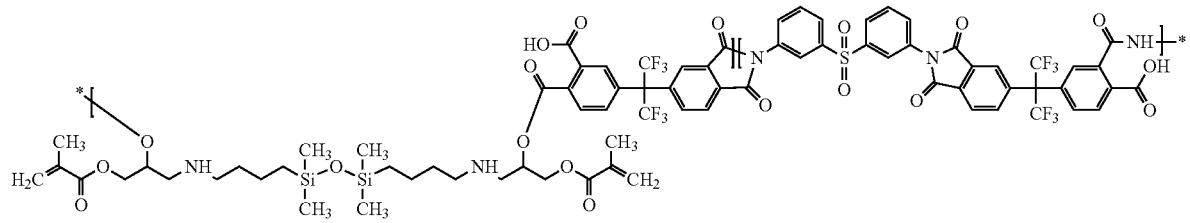

[Chemical Formula 3-4]

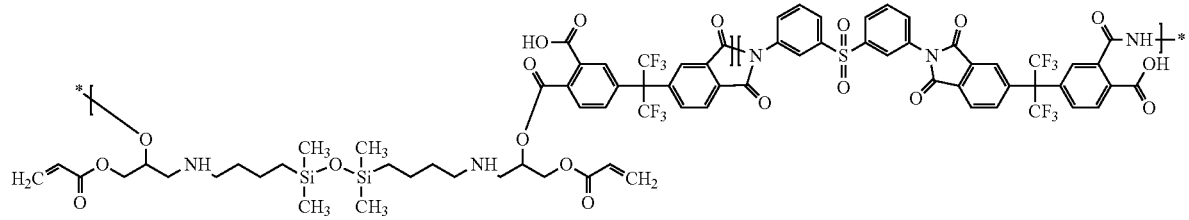

[Chemical Formula 3-5]
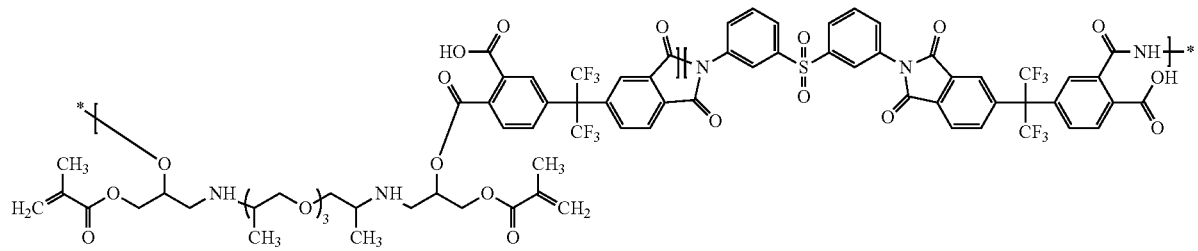
[Chemical Formula 3-6]
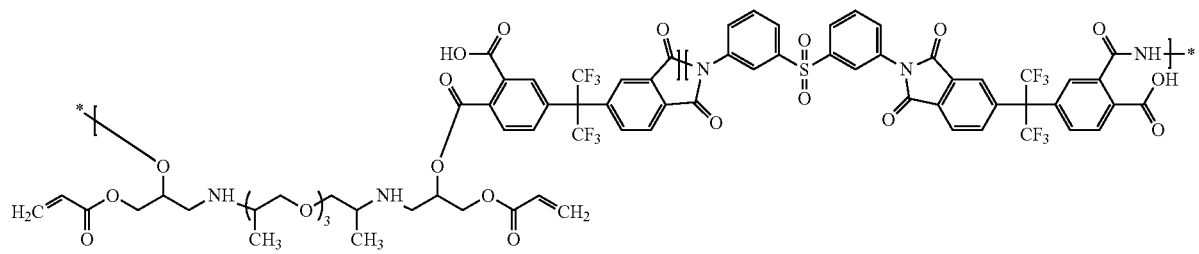
For example, the structural unit represented by Chemical Formula 4 may be represented by one of Chemical Formula 4-1 to Chemical Formula 4-4.
[Chemical Formula 4-1]
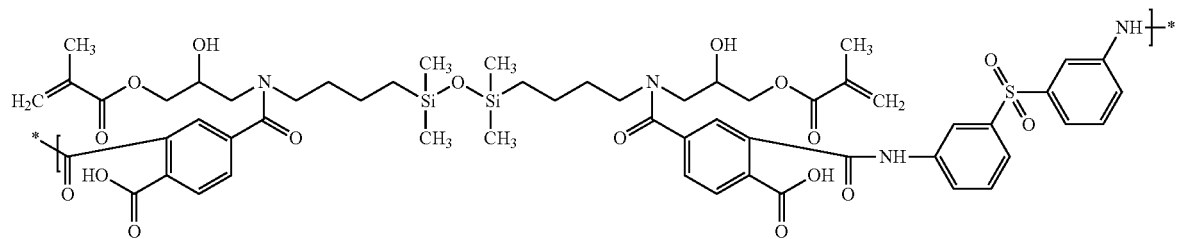
[Chemical Formula 4-2]
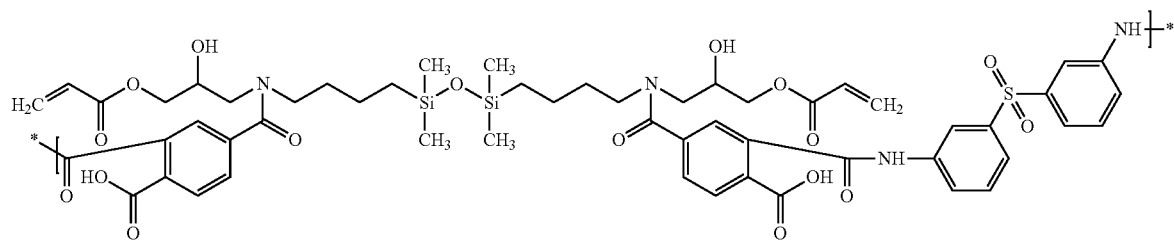
[Chemical Formula 4-3]
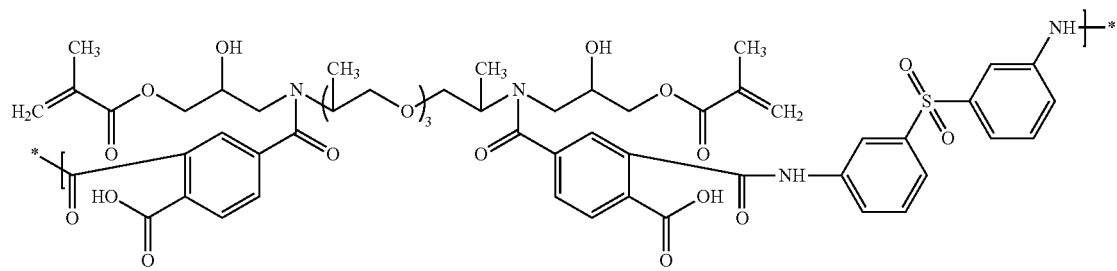

-continued

[Chemical Formula 4-4]

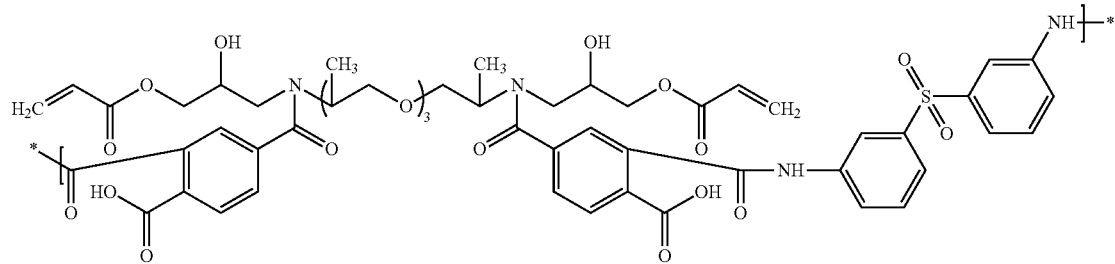

The polymer may have a weight average molecular weight of, for example, about 3,000 g/mol to about 20,000 g/mol. When the polymer has a weight average molecular weight within the ranges, excellent pattern-forming capability may be obtained, and a thin film may having excellent mechanical thermal characteristics may be provided.

The polymer may be included in an amount of about 1 wt % to about 30 wt % based on a total amount of the photosensitive resin composition. When the polymer is included within the range, sensitivity, developability, resolution, and linearity of a pattern may be improved.

(B) Black Colorant

The black colorant in a photosensitive resin composition according to an embodiment may include an organic black pigment in order to improve light-blocking properties and realize black easily. For example, a lactam-based organic black pigment may be used.

In general, only carbon black is used as a black colorant in order to improve light-blocking properties. If carbon black is used alone, excellent optical density may be obtained, but other characteristics such as electrical characteristics and the like may be deteriorated.

According to an embodiment, when an organic black pigment is used as the black colorant, light-blocking properties may be relatively more deteriorated than when the carbon black is used alone but the organic black pigment may provide sufficient light-blocking performance and simultaneously further improve the other characteristics such as electrical characteristics and the like.

In an example embodiment, the black colorant in the photosensitive resin composition may further include carbon black along with the organic black pigment and may further improve light-blocking properties. A black pigment by color mixing RGB black and the like besides the organic black pigment may be also used, or each of them may be used.

When the organic black pigment or a mixture of the organic black pigment and carbon black that is an inorganic black pigment is used as the black colorant, a dispersing agent may be used therewith to disperse the pigment. The pigment may be pretreated with the dispersing agent on the surface or added therewith to prepare the composition.

The dispersing agent may, for example, be a non-ionic dispersing agent, an anionic dispersing agent, a cationic dispersing agent, and the like. Specific examples of the dispersing agent may be polyalkylene glycol and esters thereof, polyoxyalkylene, a polyhydric alcohol ester alkylene oxide addition product, an alcohol alkylene oxide addition product, a sulfonate ester, a sulfonate salt, a carboxylate ester, a carboxylate salt, alkyl amide alkylene oxide addition product, alkyl amine, and the like, and these may be used alone or as a mixture of two or more.

Commercially available examples of the dispersing agent may include, for example, DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001 made by BYK Co., Ltd.; EFKA-47, EFKA-47EA, EFKA-48, EFKA-49, EFKA-100, EFKA-400, EFKA-450 made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, PB821, and the like made by Ajinomoto Inc.

The dispersing agent may be included in an amount of, for example, about 0.1 wt % to about 15 wt % based on a total amount of the photosensitive resin composition. When the dispersing agent is included within the range, the composition may have excellent stability, developability, and pattern-forming capability due to improved dispersion properties during manufacture of a black defining layer material.

The pigment may be pre-treated, for example, using a water-soluble inorganic salt and a wetting agent. When the pigment is pre-treated, an average particle diameter of the pigment may become finer.

The pre-treatment may be performed by, for example, kneading the pigment with a water-soluble inorganic salt and a wetting agent, and then filtering and washing the kneaded pigment.

The kneading may be performed at a temperature of, for example, about 40° C. to about 100° C., and the filtering and washing may be performed by, for example, filtering the pigment after washing away an inorganic salt with water and the like.

Examples of the water-soluble inorganic salt may be sodium chloride, potassium chloride, and the like, but are not limited thereto. The wetting agent may make the pigment to be mixed with the water-soluble inorganic salt uniformly and be pulverized. Examples of the wetting agent include alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used alone or as a mixture of two or more.

The pigment after the kneading may have an average particle diameter ranging from, for example, about 5 nm to about 200 nm, for example about 5 nm to about 150 nm. When the pigment has an average particle diameter within the range, stability of pigment dispersion liquid may be improved and pixel resolution may not be deteriorated.

The pigment may be used in a form of pigment dispersion liquid including the dispersing agent and a solvent which will be described below, and the pigment dispersion liquid may include, for example, a solid pigment, a dispersing agent, and a solvent. The solid pigment may be included in an amount of, for example, about 5 wt % to about 40 wt %, for example about 8 wt % to about 30 wt % based on a total amount of the pigment dispersion liquid.

The black colorant may be included in a solid content of, for example, about 1 wt % to about 25 wt %, for example about 2 wt % to about 10 wt % based on a total amount of the photosensitive resin composition. For example, the black colorant may be included in an amount of about 5 wt % to about 70 wt % for a reference of the pigment dispersion liquid based on a total amount of the photosensitive resin composition. When the black colorant is included within the range, coloring effects and development performance may be improved.

(C) Photopolymerizable Monomer

The photopolymerizable monomer in the photosensitive resin composition according to an example embodiment may include a compound including at least two functional groups represented by Chemical Formula 5.

[Chemical Formula 5]

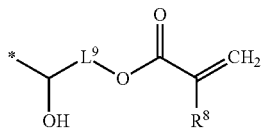

In Chemical Formula 5, $R^8$ is a hydrogen atom or a substituted or unsubstituted C1 to C10 alkyl group, $L^9$ is a single bond or a substituted or unsubstituted C1 to C10 alkylene group, and

* is a bond to another moiety of the monomer.

The photopolymerizable monomer in the photosensitive resin composition according to an embodiment may be a single compound or a mixture of two or more different kinds of compounds.

When the photopolymerizable monomer is the mixture of two or more kinds of compounds, one of the two kinds of compounds may be a compound including at least two functional groups represented by Chemical Formula 5.

For example the compound including at least two functional groups represented by Chemical Formula 5 may include 2 to 6 functional groups represented by Chemical Formula 5. In this case, during exposure of a pattern forming process, good polymerization may occur and a pattern having improved heat resistance, light resistance, and chemical resistance may be formed.

In an example embodiment, the compound including at least two functional groups represented by Chemical Formula 5 may be a compound represented by Chemical Formula 6 or Chemical Formula 7.

[Chemical Formula 6]

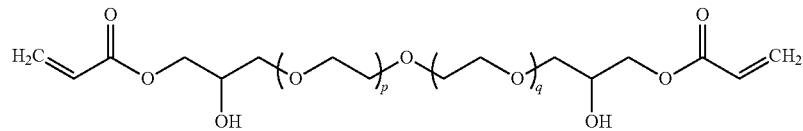

[Chemical Formula 7]

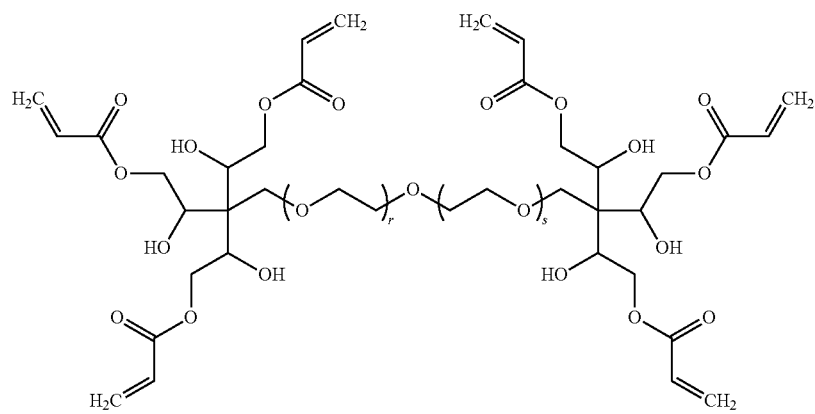

In Chemical Formula 6 and Chemical Formula 7, p, q, r, and s are independently an integer ranging from 1 to 10.

When the photopolymerizable monomer is a mixture of two or more kinds of compounds, the other compound of the two kinds of compounds may be, for example, a monofunctional or multi-functional ester compound of (meth)acrylic acid having at least one ethylenic unsaturated double bond.

The monofunctional or multi-functional ester compound of the (meth)acrylic acid having at least one ethylenic unsaturated double bond may be for example ethylene glycol di(meth)acrylate, diethylene glycol di(meth)acrylate, triethylene glycol di(meth)acrylate, propylene glycol di(meth)acrylate, neopentylglycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylolpropane tri(meth)acrylate, tris(meth)acryloyloxyethyl phosphate, novolac epoxy (meth)acrylate, or a combination thereof.

Commercially available examples of the monofunctional or multi-functional ester compound of the (meth)acrylic acid having at least one ethylenic unsaturated double bond may be as follows. Examples of the mono-functional (meth)acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.). KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. The products may be used alone or as a mixture of two or more.

The photopolymerizable monomer may be treated, for example, with acid anhydride to improve developability.

The photopolymerizable monomer may be included in an amount of, for example, about 0.5 wt % to about 10 wt %, for example about 1 wt % to about 5 wt % based on a total amount of the photosensitive resin composition. When the photopolymerizable monomer is included within the ranges, the reactive unsaturated compound may be well cured during exposure in a pattern-forming process and has excellent reliability and thus, may form a pattern having improved heat resistance, light resistance, and chemical resistance and also, excellent resolution and close-contacting properties.

(D) Photopolymerization Initiator

A photosensitive resin composition according to an example embodiment includes a photopolymerization initiator. The photopolymerization initiator may include, for example, an acetophenone-based compound, a benzophenone-based compound, a thioxanthone-based compound, a benzoin-based compound, a triazine-based compound, an oxime-based compound, and the like.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may be thioxanthone, 2-chlorothioxanthone, 2-methylthioxanthone, isopropyl thioxanthone, 2,4-diethyl thioxanthone, 2,4-diisopropyl thioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho-1-yl)-4,6-bis (trichloromethyl)-s-triazine, 2-(4-methoxynaphtho 1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be an O-acyl oxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Examples of the O-acyl oxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, and 1-(4-phenylsulfanyl phenyl)-butan-1-one oxime-O-acetate.

The photopolymerization initiator may further include, for example, a carbazole-based compound, a diketone-based compound, a sulfonium borate-based compound, a diazo-based compound, an imidazole-based compound, a biimidazole-based compound, a fluorene-based compound, and the like besides the compounds.

The photopolymerization initiator may be included in an amount of, for example, about 0.1 wt % to about 5 wt %, for example about 1 wt % to about 3 wt % based on a total amount of the photosensitive resin composition. When the photopolymerization initiator is included within the range, the composition may be sufficiently photopolymerized when exposed to light during the pattern-forming process for preparing a black pixel defining layer, accomplishing excellent sensitivity and improving transmittance.

(E) Solvent

The solvent may be a material having compatibility with the binder resin, the pigment dispersion liquid including the black colorant, the photopolymerizable monomer, and the photopolymerization initiator, but not reacting therewith.

Examples of the solvent may include alcohols such as methanol, ethanol, and the like; ethers such as dichloroethylether, n-butylether, diisoamylether, methylphenylether, tetrahydrofuran, and the like; glycolethers such as ethylene glycolmonomethylether, ethylene glycolmonoethylether, ethylene glycoldimethylether, and the like; cellosolve acetates such as methylcellosolveacetate, ethylcellosolveacetate, diethylcellosolveacetate, and the like; carbitols such as methylethylcarbitol, diethylcarbitol, diethylene glycolmonomethylether, diethylene glycolmonoethylether, diethylene glycoldimethylether, diethylene glycolethylmethylether, diethylene glycoldiethylether, and the like; propylene glycolalkyletheracetates such as propylene glycolmethyletheracetate, propylene glycolpropyletheracetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxyacetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxypropionic acid alkyl esters such as 3-oxymethyl propionate, 3-oxyethyl propionate, and the like; 3-alkoxy propionic acid alkyl esters such as 3-methoxymethyl propionate, 3-methoxyethyl propionate, 3-ethoxyethyl propionate, 3-ethoxymethyl propionate, and the like; 2-oxypropionic acid alkyl esters such as 2-oxymethyl propionate, 2-oxyethyl propionate, 2-oxy propyl propionate, and the like; 2-alkoxypropionic acid alkyl esters such as 2-methoxymethyl propionate, 2-methoxyethyl propionate, 2-ethoxyethyl propionate, 2-ethoxymethyl propionate, and the like; 2-oxy-2-methylpropionic acid esters such as 2-oxy-2-methylmethyl propionate, 2-oxy-2-methylethyl propionate, and the like; monooxymonocarboxylic acid alkyl esters of 2-alkoxy-2-methylpropionic acid alkyl such as 2-methoxy-2-methylmethyl propionate, 2-ethoxy-2-methylethyl propionate, and the like; esters such as 2-hydroxyethyl propionate, 2-hydroxy-2-methylethyl propionate, hydroxyl ethyl acetate, 2-hydroxy-3-methyl methyl butanoate, and the like; and ketonate esters such as ethyl pyruvate, and the like, and additionally a high boiling point solvent such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like.

Considering miscibility and reactivity, glycol ethers such as ethylene glycol monoethylether, ethylene glycol dimethylether, ethylene glycol diethylether, diethylene glycolethylmethylether, and the like; ethylene glycol alkyl ether acetates such as ethyl cellosolve acetate, and the like; esters such as 2-hydroxyethyl propionate, and the like; carbitols such as diethylene glycolmonomethylether, and the like; propylene glycol alkyl ether acetates such as propylene glycolmonomethyl ether acetate, propylene glycolpropyl-etheracetate, and the like may be preferably used.

The solvent may be used in a balance amount, for example, about 30 wt % to about 80 wt % based on a total amount of the photosensitive resin composition. When the solvent is included within the range, the photosensitive resin composition may have an appropriate viscosity resulting in improvement of coating characteristics of a black pixel defining layer.

(F) Other Additives

The photosensitive resin composition may further include an additive of malonic acid, 3-amino-1,2-propanediol, a silane-based coupling agent, a leveling agent, a surfactant, a radical polymerization initiator, or a combination thereof.

The silane-based coupling agent may, for example, have a reactive substituent of a vinyl group, a carboxyl group, a methacryloxy group, an isocyanate group, an epoxy group, and the like, in order to improve close-contacting properties with a substrate.

Examples of the silane-based coupling agent may include trimethoxysilylbenzoic acid, γ-methacryloxypropyltrimethoxysilane, vinyltriacetoxysilane, vinyltrimethoxysilane, 7-isocyanatepropyltriethoxysilane, γ-glycidoxypropyltrimethoxysilane, β-(3,4-epoxycyclohexyl) ethyltrimethoxysilane, and the like. These may be used alone or in a mixture of two or more.

The silane-based coupling agent may be included in an amount of, for example, about 0.01 parts by weight to about 10 parts by weight based on 100 parts by weight of the photosensitive resin composition. When the silane-based coupling agent is included within the range, close-contacting properties, storage properties, and the like may be improved.

The photosensitive resin composition may further include a surfactant, for example a fluorine-based surfactant and/or a silicone-based surfactant in order to improve coating properties and prevent a defect if necessary.

Examples of the fluorine-based surfactant may be a commercial fluorine-based surfactant such as BM-1000®, and BM-1100® (BM Chemie Inc.); MEGAFACE F 142D®, F 172®, F 173®, F 183® and F 554® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, and the like (Toray Silicone Co., Ltd.).

The silicone-based surfactant may be, for example, BYK-307, BYK-333, BYK-361N, BYK-051, BYK-052, BYK-053, BYK-067A, BYK-077, BYK-301, BYK-322, BYK-325, and the like, which are made by BYK Chem and commercially available.

The surfactant may be used in an amount of, for example, about 0.001 to about 5 parts by weight based on 100 parts by weight of the photosensitive resin composition. When the surfactant is included within the range, excellent wetting on an IZO substrate or a glass substrate as well as coating uniformity may be secured, a stain may not be produced.

Furthermore, the photosensitive resin composition may include other additives such as an antioxidant, a stabilizer, and the like in a predetermined amount that does not deteriorate properties of the photosensitive resin composition.

The photosensitive resin composition according to an embodiment may be either positive or negative. In an implementation, the photosensitive resin composition may be negative, which may effectively remove residues in regions where a pattern is exposed after exposing and developing the composition having light-blocking properties.

Another embodiment provides a black pixel defining layer manufactured by exposure, development, and curing of the photosensitive resin composition.

An example method of manufacturing the black pixel defining layer is as follows.

(1) Coating and Film Formation

The photosensitive resin composition may be coated to have a desired thickness on a substrate such as a glass substrate or an ITO substrate which undergoes a predetermined pretreatment, using, for example, a spin or slit coating, a roll coating method, a screen-printing method, an applicator method, and the like, and may be heated at about 70° C. to about 110° C. for about 1 minute to 10 minutes to remove a solvent, forming a photosensitive resin layer.

(2) Exposure

The photosensitive resin layer may be patterned by disposing a mask and then, radiating an actinic ray ranging from about, for example, 200 nm to about 500 nm. The radiation may be performed by using a light source such as a mercury lamp with a low pressure, a high pressure, or an ultrahigh pressure, a metal halide lamp, an argon gas laser, and the like. An X ray, an electron beam, and the like may be also used.

The exposure process may use, for example, a light dose of about 500 mJ/cm$^2$ or less (with a 365 nm sensor) when a high pressure mercury lamp is used. However, the light dose may vary depending on kinds of each component, its combination ratio, and a dry film thickness.

(3) Development

After the exposure process, an alkali aqueous solution may be used to develop the exposed film by dissolving and removing an unnecessary part except the exposed part, forming a pattern.

(4) Post-Treatment

In an implementation, the developed image pattern may be post-heated, which may help provide excellent quality in terms of heat resistance, photo resistance, close contacting properties, crack-resistance, chemical resistance, high strength, storage stability, and the like. For example, after development, heat-treatment may be performed under a nitrogen atmosphere in a convection oven of about 250° C. for about 1 hour.

Another embodiment provides a display device including the black pixel defining layer.

The display device may be, for example, an organic light emitting diode (OLED).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis of Polymer

Synthesis Example 1

The compound represented by Chemical Formula A-1 (an unsubstituted dianhydride monomer, 0.046 mol) was dissolved in dimethyl acetamide (DMAc, 103 g) in a four-necked flask equipped with a stirrer, a thermostat, a nitrogen gas injector, and a condenser, while nitrogen was passed therethrough.

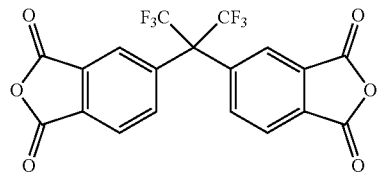

[Chemical Formula A-1]

Pyridine (0.1 mol) and HEA (hydroxy ethyl acrylate, 0.023 mol) were sequentially added thereto. When a reaction was complete, a compound represented by Chemical Formula B-1 (a substituted diamine monomer, 0.017 mol) was dissolved in dimethyl acetamide (DMAc, 1.34 g).

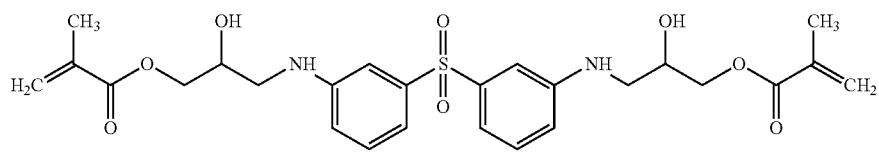

[Chemical Formula B-1]

When the reaction was complete (when not completed, a temperature was further increased), a compound represented by Chemical Formula C-1 (an unsubstituted diamine monomer, 0.017 mol) was completely dissolved in dimethyl acetamide (DMAc, 17.41 g), and then, the solution was add thereto dropwise at 5° C. for 30 minutes.

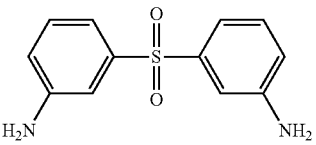

[Chemical Formula C-1]

When the dropwise addition was complete, the obtained mixture was reacted at 40° C. for 2 hours. Subsequently, acetic anhydride (Ac$_2$O, 0.052 mol) was added thereto, and the obtained mixture was reacted at 60° C. for 5 hours to complete a polyimidization reaction. The reaction mixture was added to deionized water (DIW) in a six times more amount thereof to produce a precipitate, and the precipitate was filtered, sufficiently washed with water, and dried at 30° C. under vacuum for 24 hours. The dried slurry was dissolved to be 20 wt % in ethylene glycoldimethylether (EDM), and the solution was evaporated to have moisture of less than or equal to 500 ppm and resultantly, synthesize a polymer including a structural unit represented by Chemical Formula 3-1.

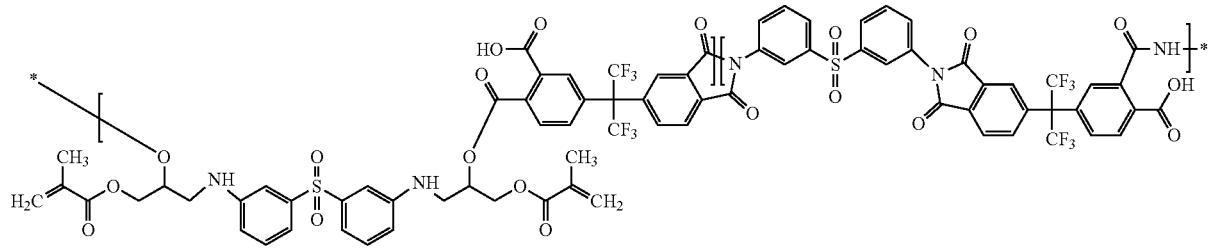

[Chemical Formula 3-1]

A weight average molecular weight of the polymer including a structural unit represented by Chemical Formula 3-1 was 6,000 g/mol in terms of standard reduction to polystyrene according to a GPC (Gel Permeation Chromatography) method.

Synthesis Example 2

A polymer including a structural unit represented by Chemical Formula 3-2 was synthesized according to the same method as Synthesis Example 1 except for using a compound represented by Chemical Formula B-2 instead of the compound represented by Chemical Formula B-1 as the substituted diamine monomer.

[Chemical Formula B-2]

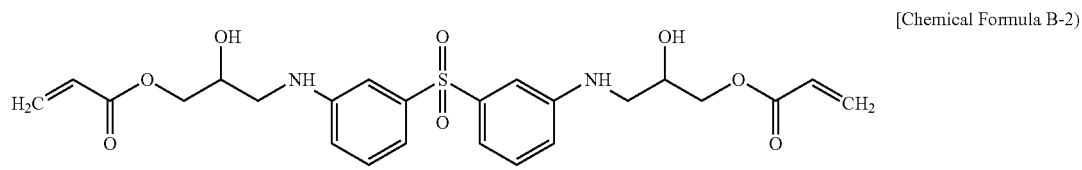 [SMILES: C=CC(=O)OCC(O)CNc1cccc(S(=O)(=O)c2cccc(NCC(O)COC(=O)C=C)c2)c1]

A weight average molecular weight of the polymer including a structural unit represented by Chemical Formula 3-2 was 5,800 g/mol in terms of standard reduction to polystyrene according to a GPC (Gel Permeation Chromatography) method.

[Chemical Formula 3-2]

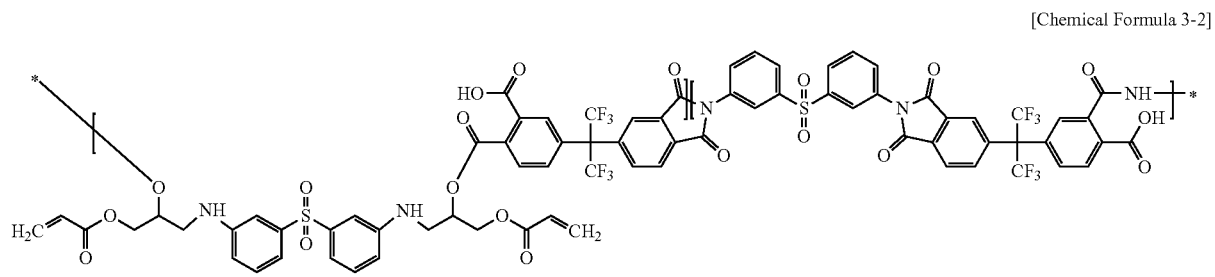

Synthesis Example 3

A polymer including a structural unit represented by Chemical Formula 3-3 was synthesized according to the same method as Synthesis Example 1 except for using a compound represented by Chemical Formula B-3 instead of the compound represented by Chemical Formula B-1 as the substituted diamine monomer.

[Chemical Formula B-3]

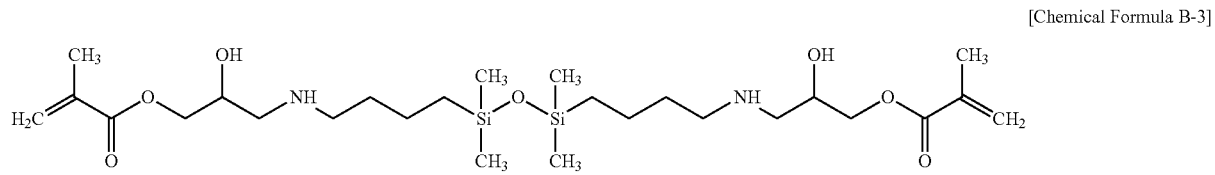 [SMILES: C=C(C)C(=O)OCC(O)CNCCCC[Si](C)(C)O[Si](C)(C)CCCCNCC(O)COC(=O)C(=C)C]

A weight average molecular weight of the polymer including a structural unit represented by Chemical Formula 3-3 was 5,400 g/mol in terms of standard reduction to polystyrene according to a GPC (Gel Permeation Chromatography) method.

[Chemical Formula 3-3]

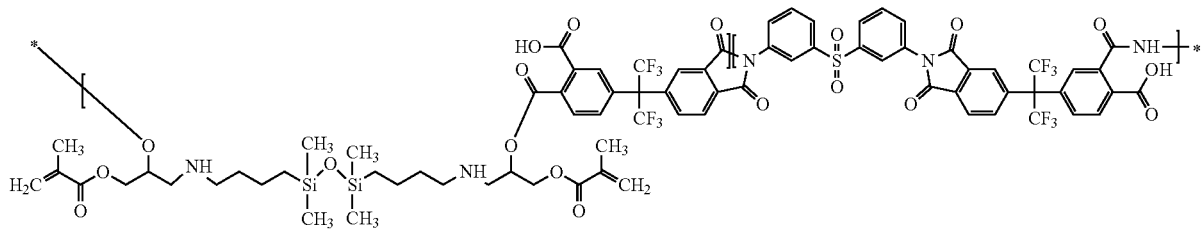

Synthesis Example 4

A polymer including a structural unit represented by Chemical Formula 3-4 was synthesized according to the same method as Synthesis Example 1 except for using a compound represented by Chemical Formula B-4 instead of the compound represented by Chemical Formula B-1 as the substituted diamine monomer.

[Chemical Formula B-4]

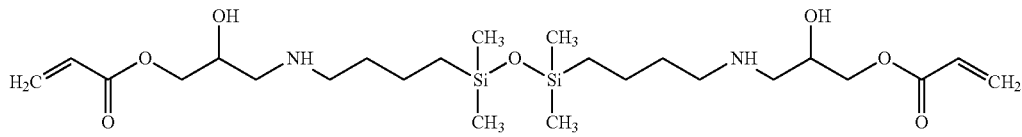

A weight average molecular weight of the polymer including a structural unit represented by Chemical Formula 3-4 was 4,800 g/mol in terms of standard reduction to polystyrene according to a GPC (Gel Permeation Chromatography) method.

[Chemical Formula 3-4]

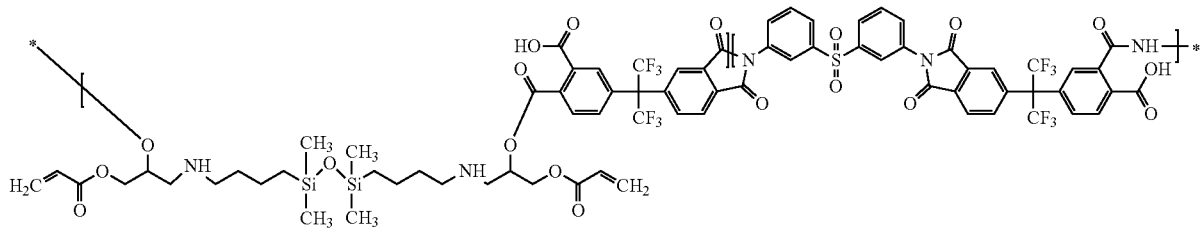

Synthesis Example 5

A polymer including a structural unit represented by Chemical Formula 3-5 was synthesized according to the same method as Synthesis Example 1 except for using a compound represented by Chemical Formula B-5 instead of the compound represented by Chemical Formula B-1 as the substituted diamine monomer.

[Chemical Formula B-5]

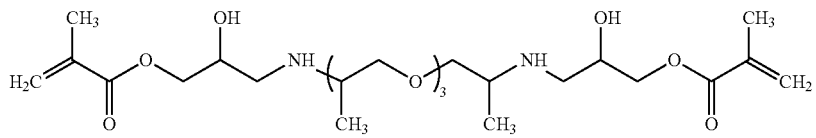

A weight average molecular weight of the polymer including a structural unit represented by Chemical Formula 3-5 was 5,200 g/mol in terms of standard reduction to polystyrene according to a GPC (Gel Permeation Chromatography) method.

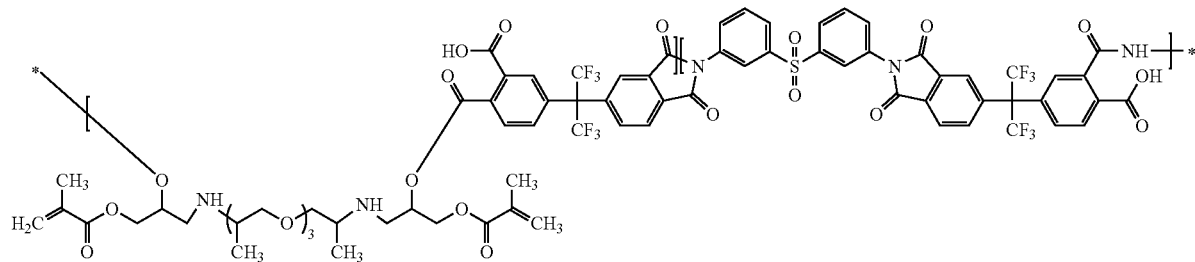

[Chemical Formula 3-5]

Synthesis Example 6

A polymer including a structural unit represented by Chemical Formula 3-6 was synthesized according to the same method as Synthesis Example 1 except for using a compound represented by Chemical Formula B-6 instead of the compound represented by Chemical Formula B-1 as the substituted diamine monomer.

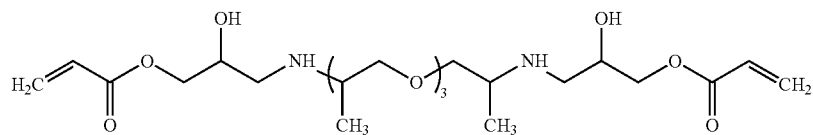

[Chemical Formula B-6]

A weight average molecular weight of the polymer including a structural unit represented by Chemical Formula 3-6 was 4,800 g/mol in terms of standard reduction to polystyrene according to a GPC (Gel Permeation Chromatography) method.

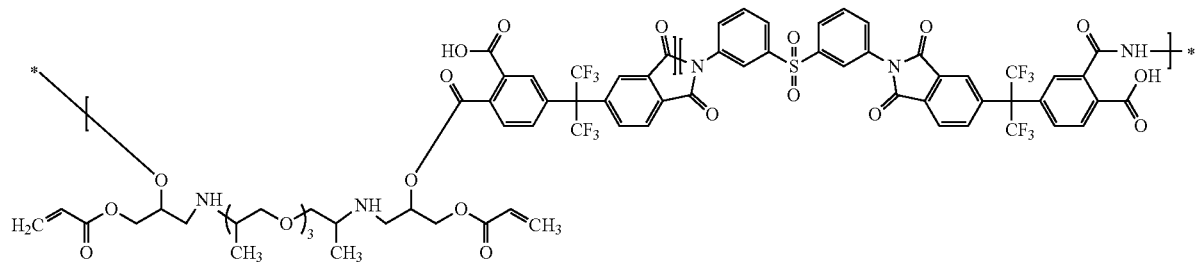

[Chemical Formula 3-6]

Synthesis Example 7

A compound represented by Chemical Formula D-1 (a substituted dianhydride monomer, 0.046 mol) was dissolved in dimethyl acetamide (DMAc, 103 g) in a four-necked flask equipped with a stirrer, a thermostat, a nitrogen gas injector, and a condenser, while nitrogen was passed through the flask.

[Chemical Formula D-1]

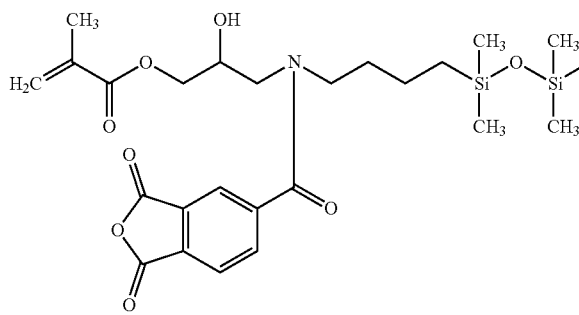

Pyridine (0.1 mol) and HEA (hydroxy ethyl acrylate, 0.023 mol) were sequentially added thereto. When a reaction was complete, a compound represented by Chemical Formula C-1 (an unsubstituted diamine monomer, 0.034 mol) was dissolved in dimethyl acetamide (DMAc, 1.34 g).

[Chemical Formula C-1]

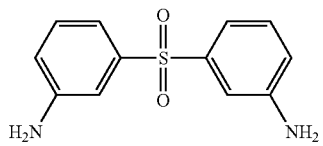

When the reaction was complete (when not completed, a temperature was further increased), the solution was dropped to the above solution at 5° C. for 30 minutes. When the dropwise addition was complete, the obtained mixture was reacted at 40° C. for 2 hours. Subsequently, the reaction mixture was added to DIW in a six times more amount thereof to generate a precipitate, and the precipitate was filtered, sufficiently washed with water, and dried at 30° C. under vacuum for 24 hours. The dried slurry was dissolved to be 20 wt % in ethylene glycoldimethylether (EDM), and the solution was evaporated to have moisture of less than or equal to 500 ppm and resultantly, synthesize a polymer including a structural unit represented by Chemical Formula 4-1.

[Chemical Formula 4-1]

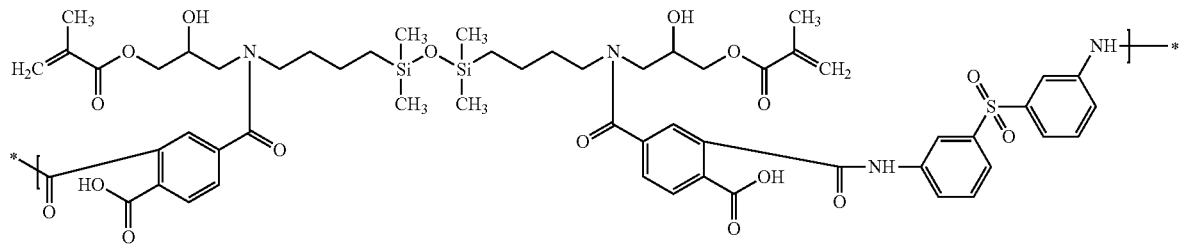

A weight average molecular weight of the polymer including a structural unit represented by Chemical Formula 4-1 was 5.300 g/mol in terms of standard reduction to polystyrene according to a GPC (Gel Permeation Chromatography) method.

Synthesis Example 8

A polymer including a structural unit represented by Chemical Formula 4-2 was synthesized according to the same method as Synthesis Example 7 except for using a compound represented by Chemical Formula D-2 instead of the compound represented by Chemical Formula D-1 as the substituted diamine monomer.

[Chemical Formula D-2]

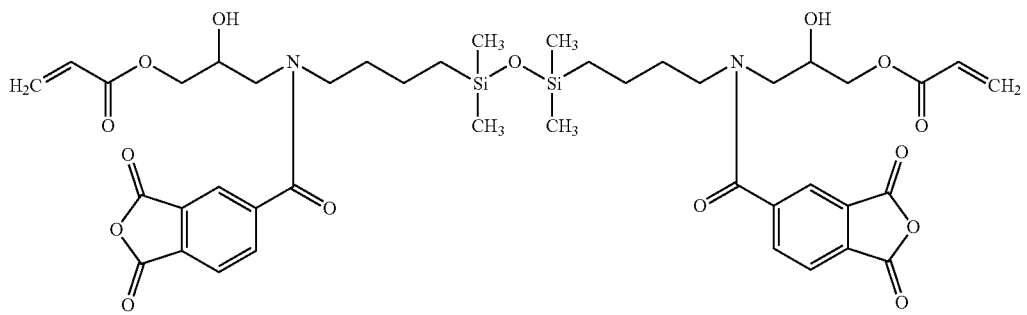

A weight average molecular weight of the polymer including a structural unit represented by Chemical Formula 4-2 was 5,800 g/mol in terms of standard reduction to polystyrene according to a GPC (Gel Permeation Chromatography) method.

Synthesis Example 10

A polymer including a structural unit represented by Chemical Formula 4-4 was synthesized according to the same method as Synthesis Example 7 except for using a compound represented by Chemical Formula D-4 instead of the compound represented by Chemical Formula D-1 as the substituted diamine monomer.

[Chemical Formula 4-2]

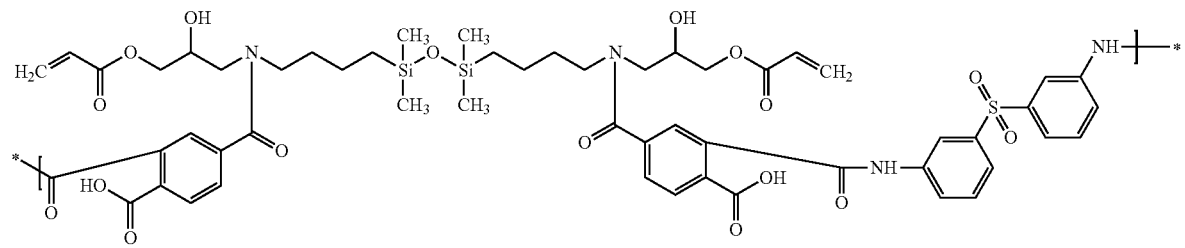

Synthesis Example 9

A polymer including a structural unit represented by Chemical Formula 4-3 was synthesized according to the same method as Synthesis Example 7 except for using a compound represented by Chemical Formula D-3 instead of the compound represented by Chemical Formula D-1 as the substituted diamine monomer.

[Chemical Formula D-3]

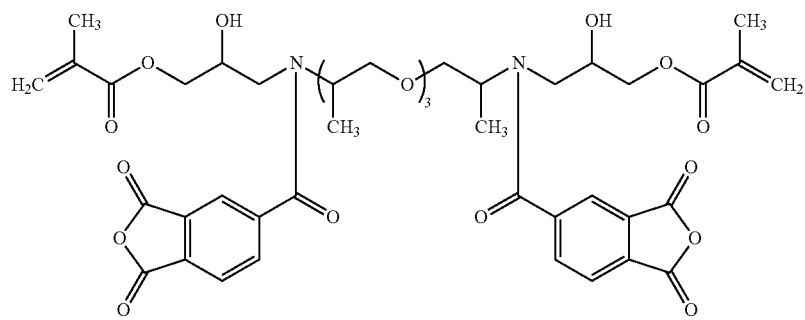

A weight average molecular weight of the polymer including a structural unit represented by Chemical Formula 4-3 was 4,900 g/mol in terms of standard reduction to polystyrene according to a GPC (Gel Permeation Chromatography) method.

[Chemical Formula 4-3]

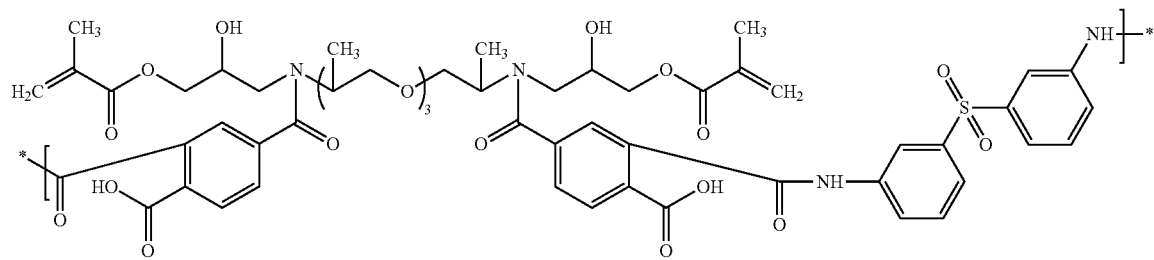

[Chemical Formula D-4]

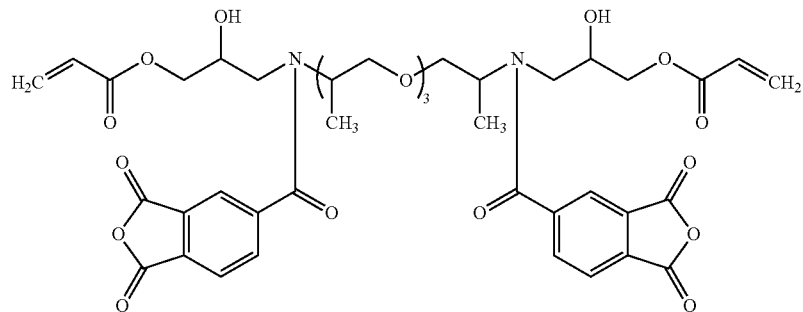

A weight average molecular weight of the polymer including a structural unit represented by Chemical Formula 4-4 was 5,200 g/mol in terms of standard reduction to polystyrene according to a GPC (Gel Permeation Chromatography) method.

[Chemical Formula 4-4]

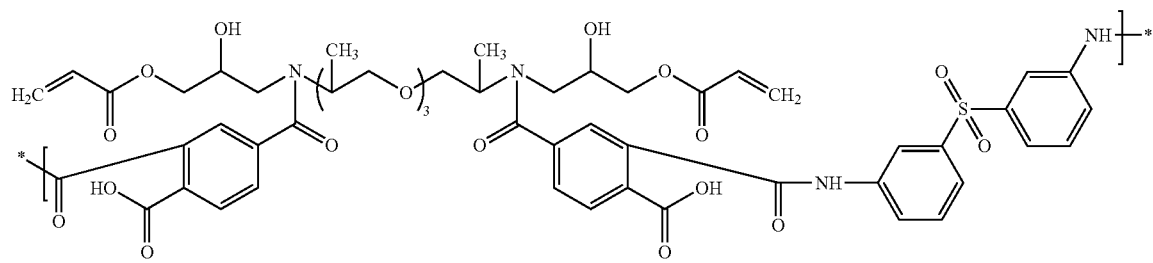

Comparative Synthesis Example 1

A compound represented by Chemical Formula A-1 (an unsubstituted dianhydride monomer, 0.046 mol) was dissolved in dimethyl acetamide (DMAc, 103 g) in a four-necked flask equipped with a stirrer, a thermostat, a nitrogen gas injector, and a condenser while nitrogen was passed therethrough.

[Chemical Formula A-1]

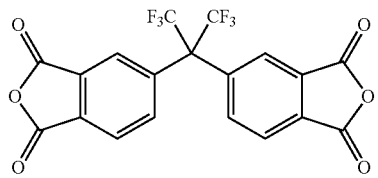

Subsequently, a compound represented by Chemical Formula C-1 (an unsubstituted diamine monomer, 0.034 mol) was completely dissolved in dimethyl acetamide (DMAc, 17.41 g), and the solution was dropped to the above solution at 5° C. for 30 minutes.

[Chemical Formula C-1]

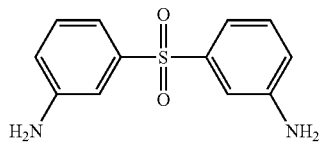

When the dropwise addition was complete, the obtained mixture was reacted at 40° C. for 4 hours. Then, this reaction mixture was added to DIW in a six times more amount thereof to produce a precipitate, and the precipitate was filtered, sufficiently washed with water, and dried at 30° C. under vacuum for 24 hours. The dried slurry was dissolved to be 20 wt % in ethylene glycoldimethylether (EDM), and the solution was evaporated to have less than or equal to 500 ppm of moisture and resultantly synthesize a polymer including a structural unit represented by Chemical Formula X-1.

[Chemical Formula X-1]

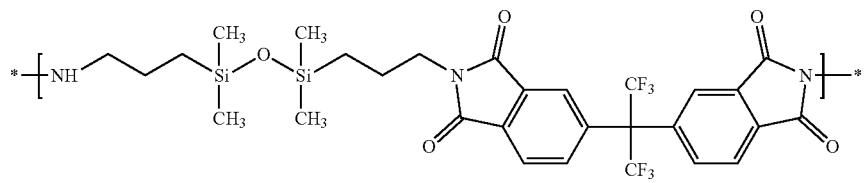

A weight average molecular weight of the polymer including a structural unit represented by Chemical Formula X-1 was 6,000 g/mol in terms of standard reduction to polystyrene according to a GPC (Gel Permeation Chromatography) method.

Preparation of Photosensitive Resin Composition

Examples 1 to 10 and Comparative Example 1

A photopolymerization initiator was dissolved in a solvent to have a composition shown in Table 1, and the solution was stirred at room temperature for 2 hours. A binder resin and a photopolymerizable monomer were added thereto, and the mixture was stirred at room temperature for one hour. Then, a surfactant (other additives) and a black colorant were added thereto, the obtained mixture was stirred for 1 hour at room temperature, and a solution obtained therefrom was entirely stirred for 2 hours. The solution was three times filtered to remove impurities and prepare each photosensitive resin composition.

TABLE 1

(unit: g)

|  |  | Ex. 1 | Ex. 2 | Ex. 3 | Ex. 4 | Ex. 5 | Ex. 6 | Ex. 7 | Ex. 8 | Ex. 9 | Ex. 10 | Comp. Ex. 1 |
|---|---|---|---|---|---|---|---|---|---|---|---|---|
| (A) binder resin | (A1) | 5 | — | — | — | — | — | — | — | — | — | — |
|  | (A2) | — | 5 | — | — | — | — | — | — | — | — | — |
|  | (A3) | — | — | 5 | — | — | — | — | — | — | — | — |
|  | (A4) | — | — | — | 5 | — | — | — | — | — | — | — |
|  | (A5) | — | — | — | — | 5 | — | — | — | — | — | — |
|  | (A6) | — | — | — | — | — | 5 | — | — | — | — | — |
|  | (A7) | — | — | — | — | — | — | 5 | — | — | — | — |
|  | (A8) | — | — | — | — | — | — | — | 5 | — | — | — |
|  | (A9) | — | — | — | — | — | — | — | — | 5 | — | — |
|  | (A10) | — | — | — | — | — | — | — | — | — | 5 | — |
|  | (A11) | — | — | — | — | — | — | — | — | — | — | 5 |
| (B) black colorant |  | 28.4 | 28.4 | 28.4 | 28.4 | 28.4 | 28.4 | 28.4 | 28.4 | 28.4 | 28.4 | 28.4 |
| (C) photopolymerizable monomer | (C1) | 0.8 | 0.8 | 0.8 | 0.8 | 0.8 | 0.8 | 0.8 | 0.8 | 0.8 | 0.8 | 0.8 |
|  | (C2) | 0.8 | 0.8 | 0.8 | 0.8 | 0.8 | 0.8 | 0.8 | 0.8 | 0.8 | 0.8 | 0.8 |
| (D) photopolymerization initiator |  | 1.2 | 1.2 | 1.2 | 1.2 | 1.2 | 1.2 | 1.2 | 1.2 | 1.2 | 1.2 | 1.2 |
| (E) solvent | (E1) | 46.65 | 46.65 | 46.65 | 46.65 | 46.65 | 46.65 | 46.65 | 46.65 | 46.65 | 46.65 | 46.65 |
|  | (E2) | 17.1 | 17.1 | 17.1 | 17.1 | 17.1 | 17.1 | 17.1 | 17.1 | 17.1 | 17.1 | 17.1 |
| (F) other additives |  | 0.05 | 0.05 | 0.05 | 0.05 | 0.05 | 0.05 | 0.05 | 0.05 | 0.05 | 0.05 | 0.05 |

(A) Binder Resin
(A1) Polymer of Synthesis Example 1
(A2) Polymer of Synthesis Example 2
(A3) Polymer of Synthesis Example 3
(A4) Polymer of Synthesis Example 4
(A5) Polymer of Synthesis Example 5
(A6) Polymer of Synthesis Example 6
(A7) Polymer of Synthesis Example 7
(A8) Polymer of Synthesis Example 8
(A9) Polymer of Synthesis Example 9
(A10) Polymer of Synthesis Example 10
(A11) Polymer of Comparative Synthesis Example 1
(B) Black Colorant
Lactam-based organic black pigment dispersion liquid (CI-IM-126, SAKATA Corp.; Solid content of organic black pigment: 15 wt %)
(C) Photopolymerizable Monomer
(C1) Dipentaerythritolhexa(meth)acrylate (DPHA, Nippon Kayaku Co. Ltd.)
(C2) Compound represented by Chemical Formula 8 (LTM II, BASF)
[Chemical Formula 8]

TABLE 1-continued (unit: g)

| | Ex. 1 | Ex. 2 | Ex. 3 | Ex. 4 | Ex. 5 | Ex. 6 | Ex. 7 | Ex. 8 | Ex. 9 | Ex. 10 | Comp. Ex. 1 |
|---|---|---|---|---|---|---|---|---|---|---|---|

[Chemical Formula 8 structure]

(in Chemical Formula 8, r and s are each 2)
(D) Photopolymerization Initiator
Oxime-based initiator (NCI-831, ADEKA Corp.)
(E) Solvent
(E-1) Propylene glycol monomethyl ether acetate (PGMEA, Sigma-Aldrich Corporation)
(E-2) Ethylene glycol dimethyl ether (EDM, Sigma-Aldrich Corporation)
(F) Other additive
Surfactant (BYK-307, BYK Chem)

Evaluation

The photosensitive resin compositions according to Examples 1 to 10 and Comparative Example 1 were respectively coated on a 10 cm*10 cm ITO glass (resistance of 30Ω), heated on a 100° C. hot plate for 1 minute in a proxy type and then, for 1 minute in a contact type to form 1.2 μm-thick photosensitive resin films. The photosensitive resin films respectively coated on the substrate were exposed to light by using a mask having variously-sized patterns and changing an exposure dose with an exposer (UX-1200SM-AKS02 of Ushio Inc.) and then, developed in a 2.38% TMAH (tetramethylammonium hydroxide) solution (an aqueous developing solution) at room temperature to dissolve the exposed region, and washed with pure water for 50 seconds to form patterns.

Sensitivity was evaluated by measuring each pattern size and calculating energy taken to realize a 20 μm pattern with a reference to a pattern size with MX51T-N633MU of Olympus Corp., and the results are shown in Table 2.

The sensitivity was measured by curing the substrates at 250° C. for 1 hour. Then, each taper angle was measured by analyzing their cross sections with a scanning electron microscope (S-4300 FE-SEM of Hitachi Ltd.), and the results are shown in Table 2.

TABLE 2

| | Sensitivity (mJ/cm$^2$) | Taper angle (°) |
|---|---|---|
| Example 1 | 70 | 32 |
| Example 2 | 50 | 30 |
| Example 3 | 75 | 32 |
| Example 4 | 55 | 30 |
| Example 5 | 70 | 32 |
| Example 6 | 55 | 29 |
| Example 7 | 50 | 29 |
| Example 8 | 40 | 28 |
| Example 9 | 55 | 28 |
| Example 10 | 40 | 27 |
| Comparative Example 1 | 150 | 32 |

Referring to Table 2, the photosensitive resin composition according to an embodiment included a polymer including the structural unit represented by Chemical Formula 1 (and the structural unit represented by Chemical Formula 2) and thus showed excellent sensitivity and maintained a low taper angle as compared with the photosensitive resin composition including the polymer without the structural unit.

By way of summation and review, a color filter, such as for a color liquid crystal display and the like, may be formed using a photosensitive resin layer such as a black pixel barrier rib layer on the border between colored layers such as red, green, blue, and the like to enhance display contrast or chromophore effects. This photosensitive resin layer may be mainly formed of a black photosensitive resin composition.

A photosensitive resin layer such as a pixel defining layer and the like used as a material for a display device panel may provide a small taper angle to secure processibility and device reliability. In addition, a colorant such as a pigment, a dye, or the like absorbing light in a visible ray region may be used in order to secure light-blocking properties.

Generally, polyimide, polybenzoxazole, or a precursor thereof may be used in a binder resin of a photosensitive resin composition in order to obtain heat resistance, sensitivity, or low out-gas characteristics. In such a case, however, a contrast ratio and sensitivity may be decreased and a taper angle may be increased during pattern formation after exposure.

As described above, embodiments may provide a photosensitive resin composition having low taper and excellent sensitivity. Embodiments may also provide a black pixel defining layer manufactured using the photosensitive resin composition. Embodiments may also provide a display device including the black pixel defining layer.

Using a photosensitive resin composition according to an example embodiment, a black pixel defining layer having excellent sensitivity while maintaining a low taper and a display device including the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising:
   (A) a binder resin, the binder resin including a polymer that includes a structural unit represented by Chemical Formula 1;
   (B) a black colorant;
   (C) a photopolymerizable monomer; and
   (D) a photopolymerization initiator,

[Chemical Formula 1]

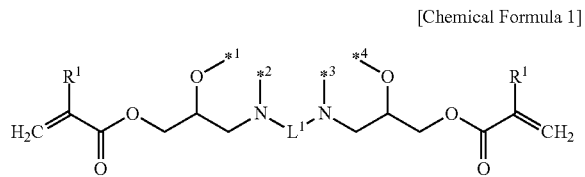

wherein, in Chemical Formula 1,
each $R^1$ is independently a hydrogen atom or a substituted or unsubstituted C1 to C20 alkyl group,
$*^1$, $*^2$, $*^3$, and $*^4$ are hydrogen atoms or backbone moieties of the polymer, provided that:
$*^1$ and $*^4$ are hydrogen atoms and $*^2$ and $*^3$ are backbone moieties of the polymer, or
$*^1$ and $*^4$ are backbone moieties of the polymer and $*^2$ and $*^3$ are hydrogen atoms, and
$L^1$ is represented by one of Chemical Formula 1-1 to Chemical Formula 1-3,

[Chemical Formula 1-1]

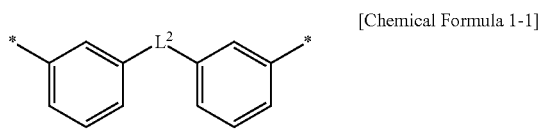

wherein, in Chemical Formula 1-1,
$L^2$ is a substituted or unsubstituted C1 to C10 alkylene group, an oxygen atom, a sulfur atom, or $-S(=O)_2-$, and
each * is a bond to another moiety of the polymer,

[Chemical Formula 1-2]

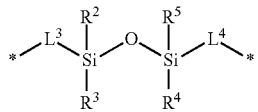

wherein, in Chemical Formula 1-2,
$R^2$ to $R^5$ are independently a hydrogen atom or a substituted or unsubstituted C1 to C10 alkyl group,
$L^3$ and $L^4$ are independently a substituted or unsubstituted C1 to C10 alkylene group, and
each * is a bond to another moiety of the polymer,

[Chemical Formula 1-3]

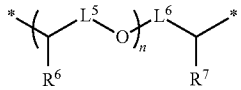

wherein, in Chemical Formula 1-3,
$R^6$ and $R^7$ are independently a hydrogen atom or a substituted or unsubstituted C1 to C10 alkyl group,
$L^5$ and $L^6$ are independently a substituted or unsubstituted C1 to C10 alkylene group,
n is an integer ranging from 1 to 10, and
each * is a bond to another moiety of the polymer.

2. The photosensitive resin composition as claimed in claim 1, wherein the polymer further includes a structural unit represented by Chemical Formula 2:

[Chemical Formula 2]

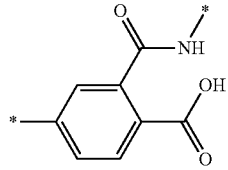

wherein each * is a bond to another moiety of the polymer.

3. The photosensitive resin composition as claimed in claim 1, wherein the polymer includes a structural unit represented by Chemical Formula 3 or Chemical Formula 4:

[Chemical Formula 3]

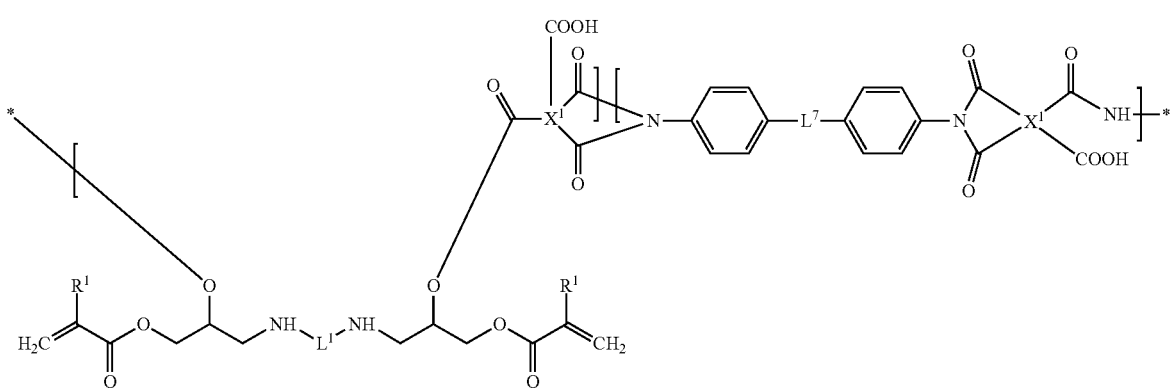

-continued

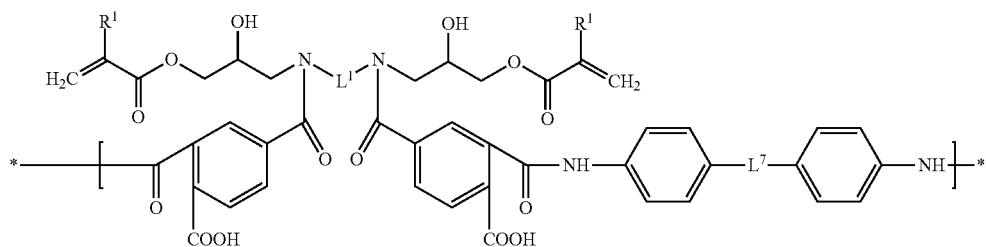

wherein, in Chemical Formula 3 and Chemical Formula 4,
each $R^1$ is independently a hydrogen atom or a substituted or unsubstituted C1 to C20 alkyl group,
$L^1$ is represented by one of Chemical Formula 1-1 to Chemical Formula 1-3,
$L^7$ is represented by Chemical Formula 1-1, and
$X^1$ is represented by Chemical Formula 1-4,

[Chemical Formula 1-4]

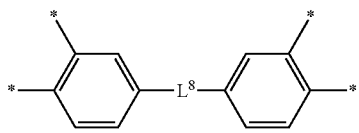

wherein, in Chemical Formula 1-4,
$L^8$ is a single bond or a substituted or unsubstituted C1 to C10 alkylene group, and
each * is a bond to another moiety of the polymer.

4. The photosensitive resin composition as claimed in claim 3, wherein:
the polymer includes the structural unit represented by Chemical Formula 3, and
the structural unit represented by Chemical Formula 3 is represented by one of Chemical Formula 3-1 to Chemical Formula 3-6:

[Chemical Formula 3-1]

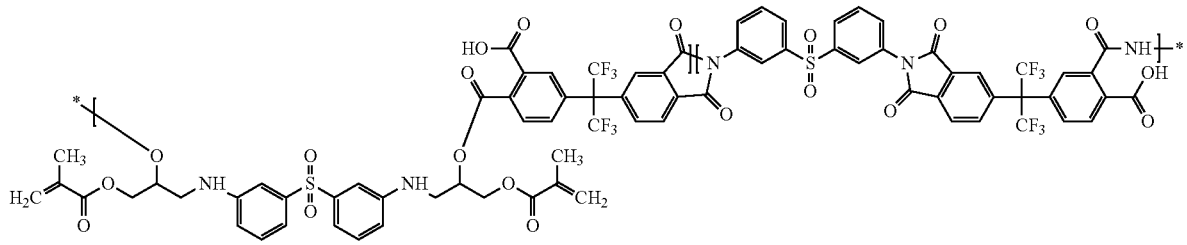

[Chemical Formula 3-2]

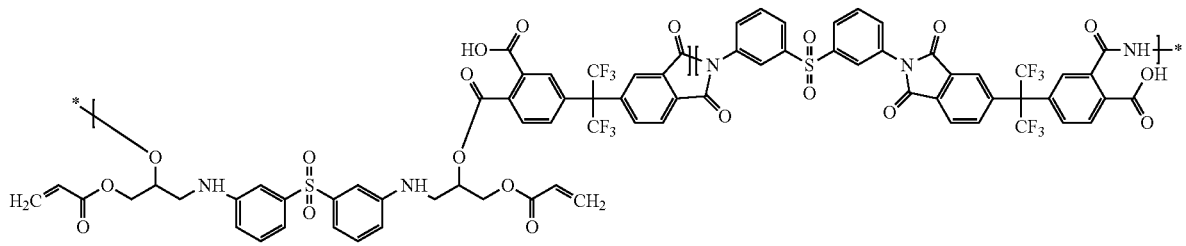

[Chemical Formula 3-3]

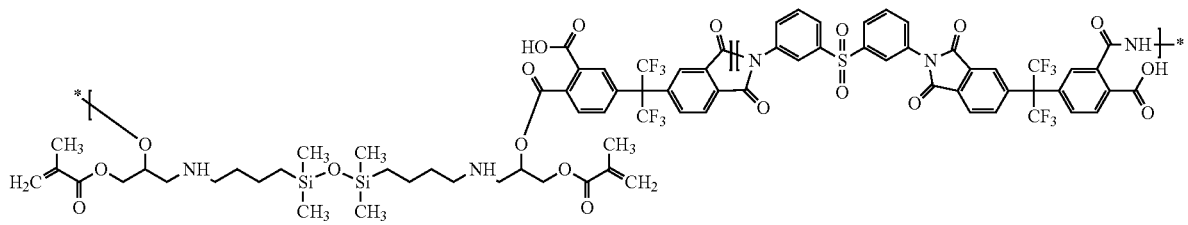

[Chemical Formula 3-4]
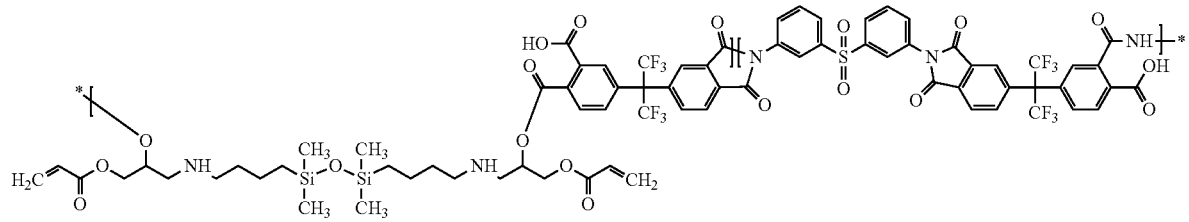
[Chemical Formula 3-5]
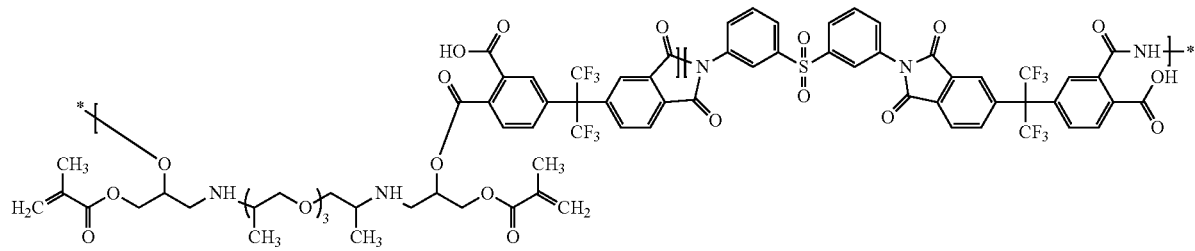
[Chemical Formula 3-6]
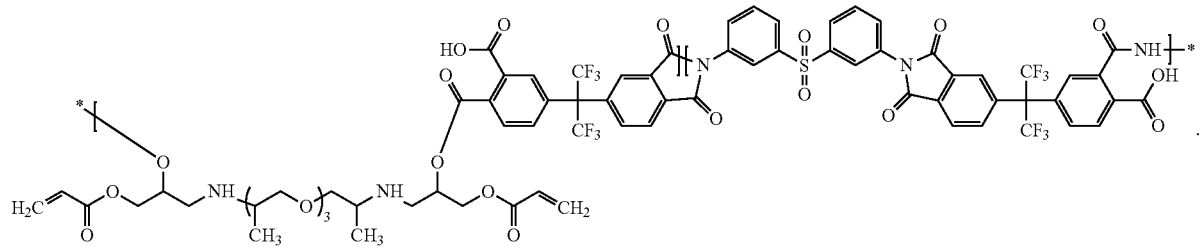
5. The photosensitive resin composition as claimed in claim 3, wherein:
the polymer includes the structural unit represented by Chemical Formula 4, and the structural unit represented by Chemical Formula 4 is represented by one of Chemical Formula 4-1 to Chemical Formula 4-4:
[Chemical Formula 4-1]
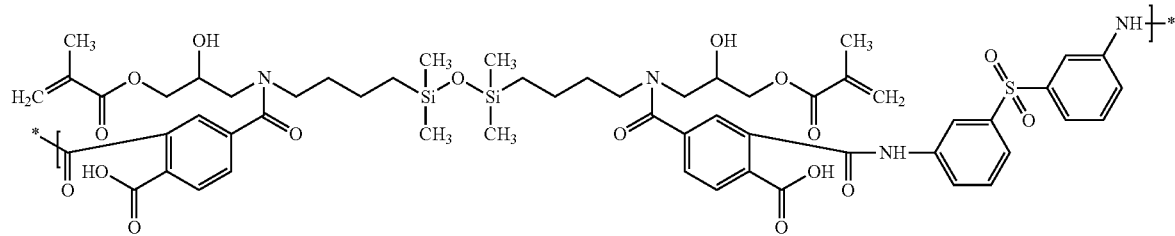
[Chemical Formula 4-2]
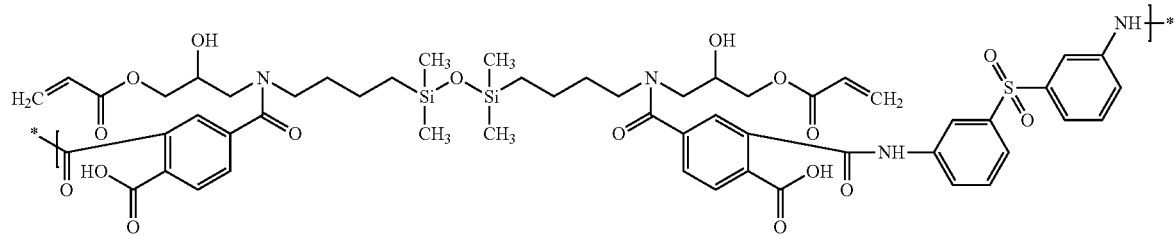

[Chemical Formula 4-3]

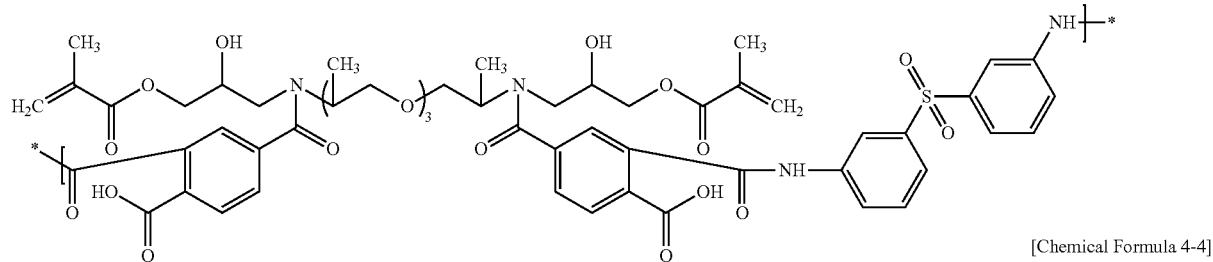

[Chemical Formula 4-4]

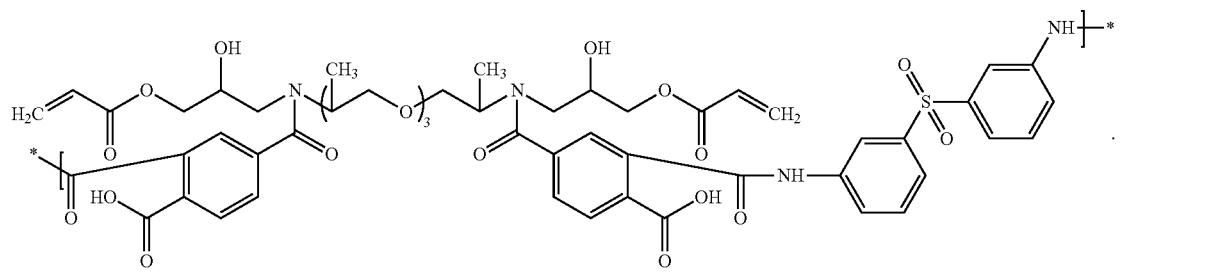

6. The photosensitive resin composition as claimed in claim 1, wherein the polymer has a weight average molecular weight of about 3,000 g/mol to about 20,000 g/mol.

7. The photosensitive resin composition as claimed in claim 1, wherein the black colorant includes an organic black pigment.

8. The photosensitive resin composition as claimed in claim 1, wherein the photopolymerizable monomer includes a compound including at least two functional groups represented by Chemical Formula 5:

[Chemical Formula 5]

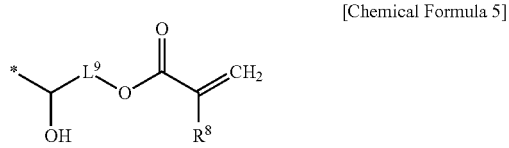

wherein, in Chemical Formula 5, $R^8$ is a hydrogen atom or a substituted or unsubstituted C1 to C10 alkyl group, $L^9$ is a single bond or a substituted or unsubstituted C1 to C10 alkylene group, and is a bond to another moiety of the monomer.

9. The photosensitive resin composition as claimed in claim 8, wherein the compound including at least two functional groups represented by Chemical Formula 5 is a compound represented by Chemical Formula 6 or Chemical Formula 7:

[Chemical Formula 6]

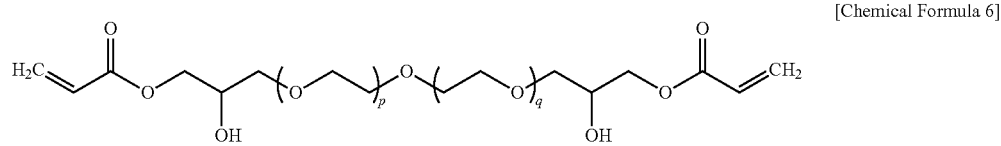

[Chemical Formula 7]

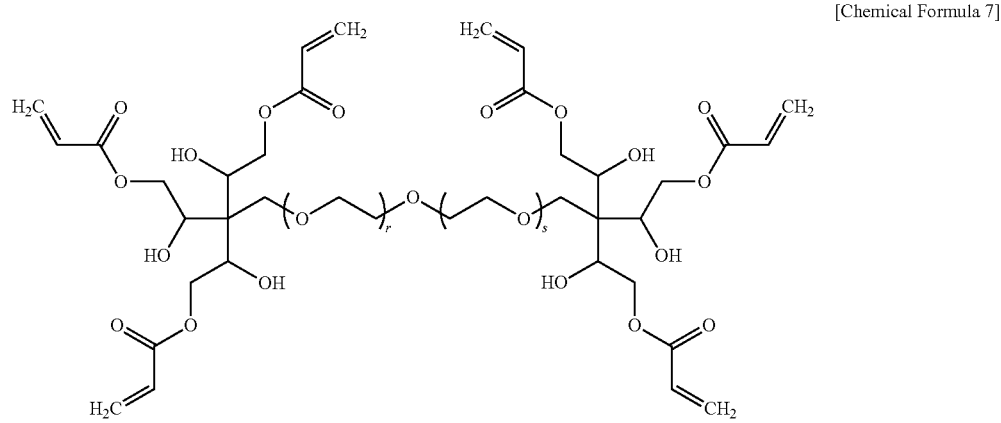

wherein, in Chemical Formula 6 and Chemical Formula 7, p, q, r, and s are independently an integer ranging from 1 to 10.

10. The photosensitive resin composition as claimed in claim 1, wherein the photosensitive resin composition includes:
about 1 wt % to about 30 wt % of (A) the polymer;
about 1 wt % to about 25 wt % of (B) the black colorant;
about 0.5 wt % to about 10 wt % of (C) the photopolymerizable monomer;
about 0.1 wt % to about 5 wt % of (D) the photopolymerization initiator; and
(E) a solvent
based on a total amount of the photosensitive resin composition.

11. The photosensitive resin composition as claimed in claim 1, wherein the photosensitive resin composition further includes malonic acid, 3-amino-1,2-propanediol, a silane-based coupling agent, a leveling agent, a surfactant, a radical polymerization initiator, or a combination thereof.

12. A black pixel defining layer manufactured using the photosensitive resin composition as claimed in claim 1.

13. A display device comprising the black pixel defining layer as claimed in claim 12.

14. The display device as claimed in claim 13, wherein the display device is an organic light emitting diode (OLED).

* * * * *